US006547458B1

United States Patent
Janos et al.

(10) Patent No.: US 6,547,458 B1
(45) Date of Patent: Apr. 15, 2003

(54) OPTIMIZED OPTICAL SYSTEM DESIGN FOR ENDPOINT DETECTION

(75) Inventors: Alan C. Janos, Darnstown, MD (US); Andre G. Cardoso, Laurel, MD (US); Daniel B. Richardson, Westminster, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/449,338

(22) Filed: Nov. 24, 1999

(51) Int. Cl.[7] .................................................. G03D 5/00
(52) U.S. Cl. .................. 396/611; 156/345.25; 156/250; 156/559.2; 156/356; 156/369; 156/118; 156/723 R
(58) Field of Search ................. 396/611, 604; 352/311, 369; 156/643, 345.25; 118/719, 722, 723 R; 250/492.1, 493.1, 559.2

(56) References Cited

U.S. PATENT DOCUMENTS

| | | | |
|---|---|---|---|
| 4,201,579 A | 5/1980 | Robinson et al. | 430/329 |
| 4,341,592 A | 7/1982 | Shortes et al. | 430/329 |
| 4,394,237 A * | 7/1983 | Donnelly et al. | 204/192.33 |
| 4,491,499 A | 1/1985 | Jerde et al. | 216/60 |
| 4,675,072 A * | 6/1987 | Bennett et al. | 156/643 |
| 4,695,700 A | 9/1987 | Provence et al. | 219/121.4 |
| 5,343,412 A * | 8/1994 | Birang | 156/626 |
| 5,498,308 A | 3/1996 | Kamarehi et al. | 156/345 |
| 5,694,207 A | 12/1997 | Hung et al. | 356/72 |
| 5,728,253 A | 3/1998 | Saito et al. | 156/345 |
| 5,739,051 A | 4/1998 | Saito | 156/345 |
| 5,770,523 A | 6/1998 | Hung et al. | 134/1.2 |
| 5,773,201 A | 6/1998 | Fujimura et al. | 430/329 |
| 5,824,604 A | 10/1998 | Bar-Gadda | 438/725 |
| 5,846,373 A | 12/1998 | Pirkle et al. | 156/345 |
| 5,877,407 A | 3/1999 | Cadet et al. | 73/24.01 |
| 5,882,489 A | 3/1999 | Bersin et al. | 204/192.35 |
| 5,908,319 A | 6/1999 | Xu et al. | 438/725 |
| 5,940,175 A * | 8/1999 | Sun | 118/719 |
| 6,074,568 A * | 6/2000 | Adachi et al. | 216/59 |
| 6,113,733 A * | 9/2000 | Eriguchi et al. | 156/345 |

FOREIGN PATENT DOCUMENTS

| WO | WO 97/37055 | 10/1997 |
|---|---|---|
| WO | WO 99/26277 | 5/1999 |

* cited by examiner

*Primary Examiner*—Della J Rutledge
(74) *Attorney, Agent, or Firm*—Watts, Hoffmann, Fisher & Heinke Co., L.P.A.

(57) ABSTRACT

The present invention is directed to optimization of the optical detection system for the use of optical emission spectroscopy in end-point detection. The optimization specifically addresses the needs of a radiant heated wafer system in a downstream process chamber environment. The present invention maximizes signal light from relevant reactions, maximizes signal-to noise and signal-to-background ratios, utilizes very small diagnostics access, collects light from the region of most intense light emission from endpoint processes, collects light from representative parts of an entire wafer with just one diagnostic access port to ensure complete end-point, and eliminates light signals from sources other than the wafer.

31 Claims, 14 Drawing Sheets

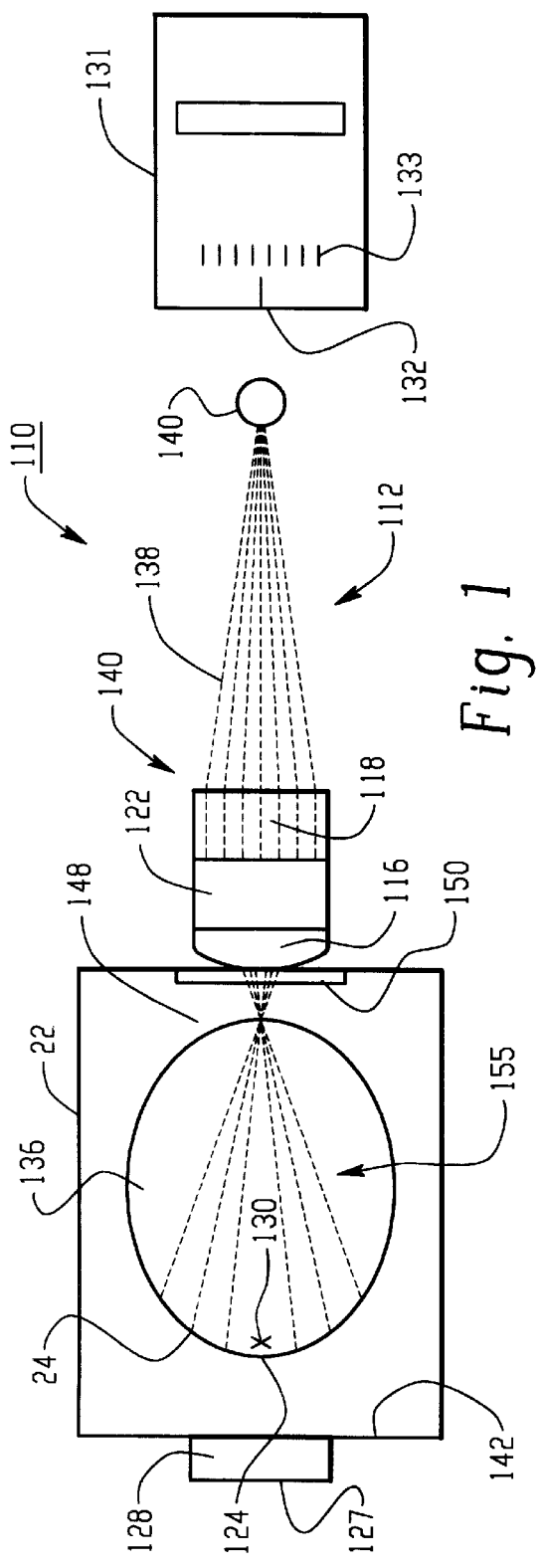
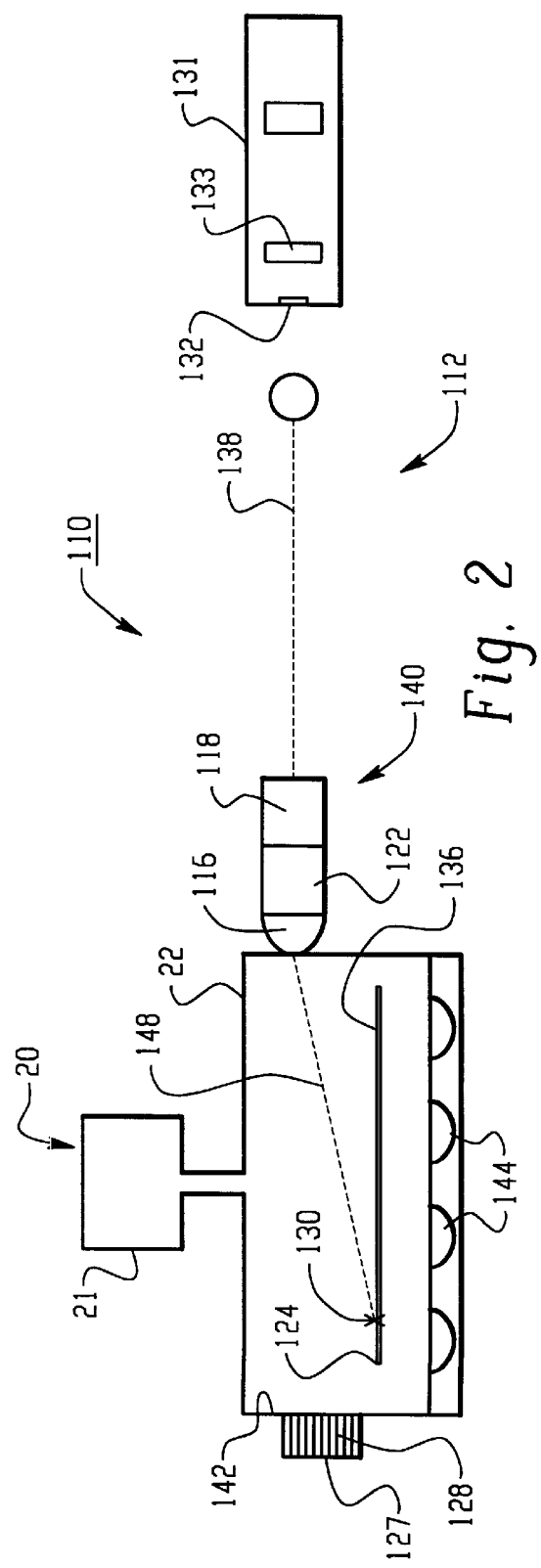
Fig. 1
Fig. 2

OPTIMIZED OPTICAL SYSTEM DESIGN FOR ENDPOINT DETECTION

FIELD OF THE INVENTION

The present invention concerns the field of optical monitoring of integrated circuit fabrication.

BACKGROUND OF THE INVENTION

During the fabrication of integrated circuits, a desired circuit pattern for a given layer of the integrated circuit is etched into a dielectric film. To accomplish this, a photoresist material is disposed on the area of the dielectric film where etching is not desired. An etching gas, which is chemically reactive with the dielectric material and less chemically reactive with the photoresist, is generated in a plasma. The plasma is then supplied to the surface of the dielectric being etched, causing the etching gas to diffuse into the surface of the dielectric film. The etching gas chemically reacts with the dielectric film to form a volatile by-product. The volatile by-product is then desorbed from the surface of the dielectric film and diffuses into the bulk of the etching gas.

After the pattern is etched into the dielectric layer, the photoresist that was used to define the metal circuit pattern on the dielectric layer is removed. Any post-etch residues including sidewall polymer deposition also must be thoroughly removed or stripped from the underlying layer. One dry process used to strip photoresist and photoresist residues from the dielectric layer is known as ashing. The process of ashing is similar to the etching process. The gas used for ashing, however, is more chemically reactive with the photoresist than with-the dielectric. The ashing gas chemically reacts with the photoresist to form a volatile by-product. The volatile by-product diffuses into the bulk of the ashing gas. After the ashing process is complete, the etched pattern is filled with copper or other conductive material.

Optical emission spectroscopy has previously been used to determine the end point of the etching process by providing information about the etching gas and the by-product of the etching gas and dielectric material. The technique relies on the change in the emission intensity of characteristic optical radiation from the dielectric by-product in the plasma. Excited atoms or molecules emit light when electrons relax from a higher energy state to, a lower energy state. Atoms and molecules of different chemical compounds emit a series of unique spectral lines. The emission intensity for each chemical compound within the plasma depends on the relative concentration of the chemical compound in the plasma. A typical optical emission spectroscopy apparatus operates by measuring the emission intensities of the reactive etching gas and the by-product of the etching gas and the dielectric. The emission of the by-product decreases and finally stops when an endpoint is reached. The optical emission spectroscopy apparatus senses the declining emission intensity of the by-product to determine this endpoint.

It is very important to accurately determine the endpoint of stripping, etching, or residue-removal processing of wafers for semiconductor devices. Accurate endpoint detection improves throughput and minimizes damage to other wafer layers. Over-ashing and under-ashing produce undesirable patterns in the integrated circuit wafer. It is difficult to accurately determine endpoint, because process chambers for semiconductor wafer processing offer very little diagnostic access. Optical emission spectroscopy (OES) has been used to determine endpoint measurements, but is inaccurate because of poor optical access to the region of the wafer. If radiant wafer heating lamps are used to promote the ashing process, the light used to heat the wafer interferes with the light emitted at the wafer surface, used to determine endpoint.

In a radiantly heated wafer process chamber the lamps used to heat the wafer emit broadband, blackbody light. The intensity of the broadband, black-body lamp emission may be several orders of magnitude greater than the emission by the reactant by-product of the coating and the plasma being monitored to detect end-point. The broadband, black-body light is most intense during a ramp phase when the lamps are on at full power. The stray light from the lamps becomes a critical issue during ramp phase. Both stray light outside the spectrometer but associated with the optics leading into the spectrometer and stray light which makes its way into the spectrometer make monitoring of the reactant by-product to determine endpoint more difficult. Stray light enters the optics monitoring system, because dirt and coating films, deposited on the optics during the ashing process, and imperfections in the optics scatter stray light into the spectrometer. Additionally, the far wall reflects and emits stray light into the field of view of the optics. The light emitted by the volatile by-product is in part reflected and diffused out of the field of view of the spectrometer by the coating on the optics and optics imperfections. Unwanted lamp light is in part diverted into the field of view of the spectrometer by the coating and dirt on the optics and imperfections in the optics. Coating and dirt on the optics reduces the by-product light, which reaches the spectrometer input and scatters lamp light into the spectrometer input. The increase in lamp light and decrease in volatile by-product light which enter the spectrometer result in a reduced signal-to-noise or signal-to-background ratio, which degrades the performance of the optical detection system.

Spectrometers are designed to direct light into a particular path for each wavelength for measurement. To accomplish this, spectrometers include numerous internal surfaces, off which the light either reflects, refracts, or is transmitted. These internal surfaces have surface imperfections and become dirty causing a small percentage of the lamp light, which enters the spectrometer, to be diffusely scattered. When lamps are used to radiantly heat the wafer a small percent of the high intensity lamp light leads to a moderately high level of randomly scattered light inside the spectrometer. Some lamp light, although at wavelengths other than the wavelength of the light emitted by the by-product, enters wavelength channels of the spectrometer designed to measure light emitted by the volatile by-product. Stray light inside the spectrometer is background or noise, scattered off the imperfect interior surface of the spectrometer. The stray light in the spectrometer results in a reduced signal-to-noise or signal-to-background ratio.

There are special problems with downstream process chambers with regard to the number of available OES signals and accessing the volume from which maximum signal is produced by the ashing and etching reactions. Often, there is both broadband light from the radiant heating lamps and the plasma itself which varies during the ashing and the etching processes, which make it more difficult to measure the light emitted by the wafer. Special cases of low ash rate processes, resulting in weak signals, also make endpoint detection more difficult.

The design of a standard etcher is distinct from the design of a downstream asher in two respects. First, the pressures associated with etchers are much lower. The lower pressure of etchers allows molecular flow, where given molecules of the reactant by-product move freely around the process chamber and bounce off numerous chamber walls many times, creating a substantially uniform distribution of by-product within the reaction chamber. Secondly, the plasma fills the process chamber and remains in the process chamber. For these two reasons, there is often nearly uniform signal strength from the reactant by-product in etchers.

The pressure in a downstream plasma asher is increased. Applicants have observed a transitional region of laminar viscous flow slightly above the wafer surface due to the increase in pressure. The reactant by-product of the coating being removed and the plasma is contained near the wafer surface by the laminar flow. The by-product being monitored is formed on or near the surface of the wafer and is constrained in this region by the laminar flow of the plasma. The region of a downstream plasma asher which is useful in monitoring by-product signal is the region extending from the wafer surface to slightly above the wafer surface.

SUMMARY OF THE INVENTION

The present invention is directed to an optically monitored wafer processing system that includes a wafer processing chamber, a wafer treatment apparatus and receiving optics. The wafer processing chamber includes a support for positioning one or more wafers. The wafer treatment apparatus includes means for routing wafer treatment material, such as a plasma, into the processing chamber for removing coating from one or more wafers. The receiving optics are mounted to the chamber in al position to monitor concentrations of the reactant by-product of the coating and the wafer treatment material on or above the surface of the wafer. The optics measure the reactant by-product on or above the surface of the wafer, where the by-product is concentrated.

The optically monitored wafer processing system may include a viewing dump. The viewing dump may be mounted, in the interior of the wafer processing chamber or to the exterior of the wafer processing chamber, adjacent to a window. In one embodiment of the invention, the viewing dump may comprise a narrow port or slot in the chamber wall opposite the optics, a blackened cover and a diamond shaped deflector within the box. The black box and deflector intercept background light within the plasma reaction chamber. The viewing dump increases the signal to background and signal to noise ratios of signals generated by the wafer processing system. Unwanted light from the wafer processing chamber is absorbed by the viewing dump rather than being detected by the optics monitoring system.

In one embodiment of the invention, a polarizer be mounted to the wafer processing chamber to filter signals emitted by the reactant by-product of the coating and the wafer treatment material. The polarizer removes background light and to a lesser extent removes the signal light of the by-product. Although the polarizer reduces desired signal, it has the benefit of increasing the signal to background and signal to noise ratios, because background and noise are removed to a much greater extent.

The receiving optics of the optically monitored wafer processing system can be configured in a linear array. Configuring the receiving optics in a linear array allows each fiber optic fiber of the array to be located near the surface of the wafer and gather light from points on and near the surface of the wafer. In this configuration, the entire line of sight of each fiber optic fiber is near the surface of the wafer. Configuring the receiving optics into a linear array maximizes the desired signal, because the line of sight of each fiber optic fiber extends through a region where the desired signal is concentrated and the background and noise are minimized.

In the preferred embodiment, the optics monitoring system includes a low pass filter. The low pass filter is placed in front of the lens, between the lens and the fiber optic fibers or between the fiber optic fibers and the spectrometer. The low pass filter selectively prevents light from passing through it to the lens, fiber optic fibers or the spectrometer. A low pass filter may be selected, which prevents light with wavelengths other than the wavelength of light emitted by the by-product of coating and plasma.

The receiving optics may also be configured in a fan shaped array. As with the linear array, each fiber optic fiber is located hear the surface of the wafer and gathers light from a point near the surface of the wafer. In the fan shaped array, the lines of sight of the receiving optics cover a greater area above the wafer. By monitoring a greater area above the wafer, a more statistically accurate signal is gathered.

The receiving optics may be arranged to monitor a uniform distribution of points on the surface of the wafer. The receiving optics may be held by a holding block with an orifice to position each optic at an appropriate distance and tangle from a receiving lens to define focal points uniformly distributed about the surface of the wafer. By monitoring a uniform distribution of points on the surface of the wafer, a larger area of the wafer is monitored, which assures more uniform endpoint detection.

These and other advantages and features of the invention will become better understood from the following detailed description of an exemplary embodiment which is described in conjunction with the drawings.

BRIEF DESCRIPTION OF THE DRAWINGS

FIG. 1 is a schematic plan view depicting an optical system for endpoint detection of the present invention;

FIG. 2 is a schematic front elevational view of an optical system for endpoint detection of the present invention;

DETAILED DESCRIPTION OF THE INVENTION

Figure 3:
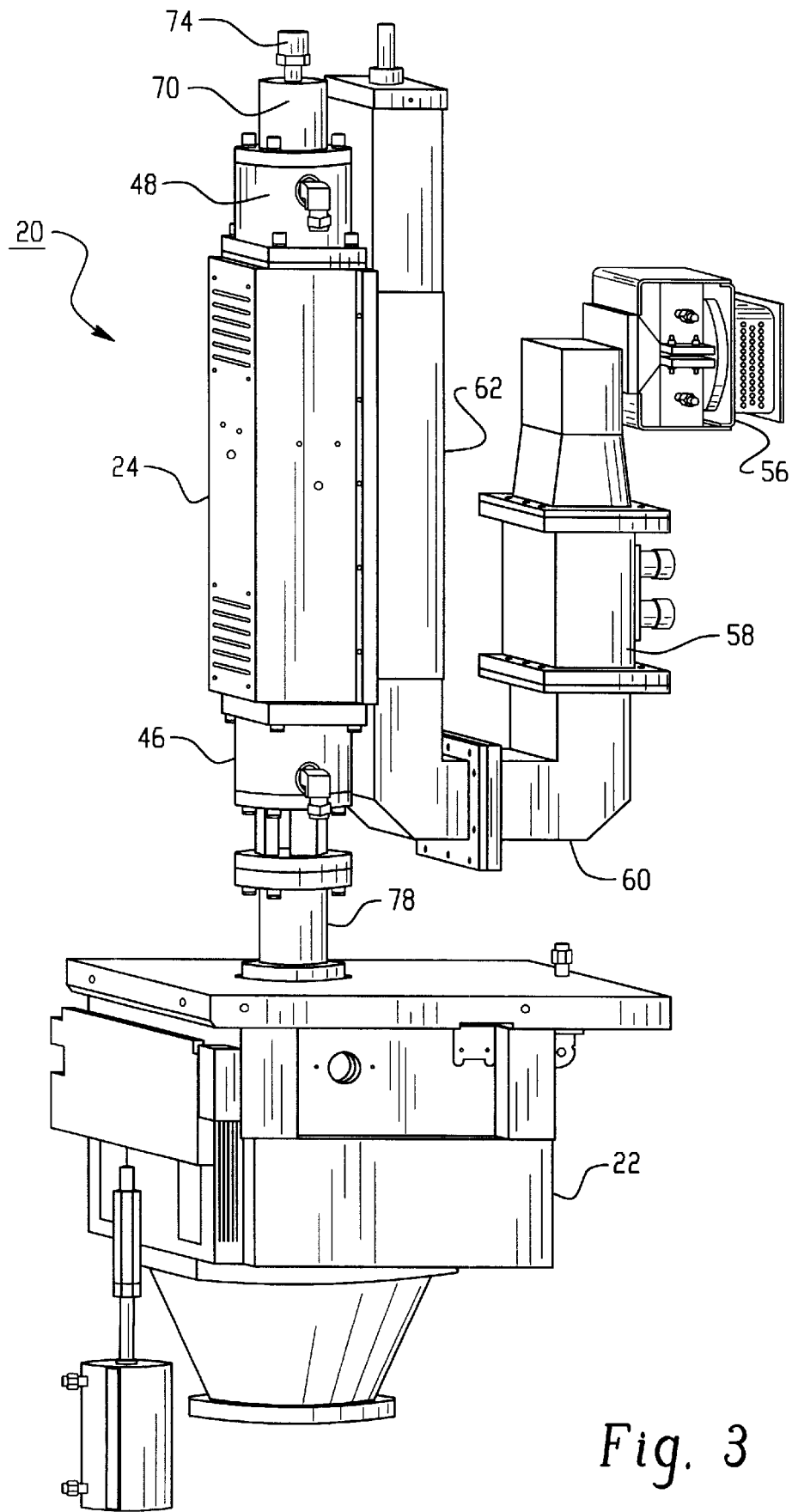
FIG. 3 is a perspective view of a microwave plasma asher.
Figure 4:
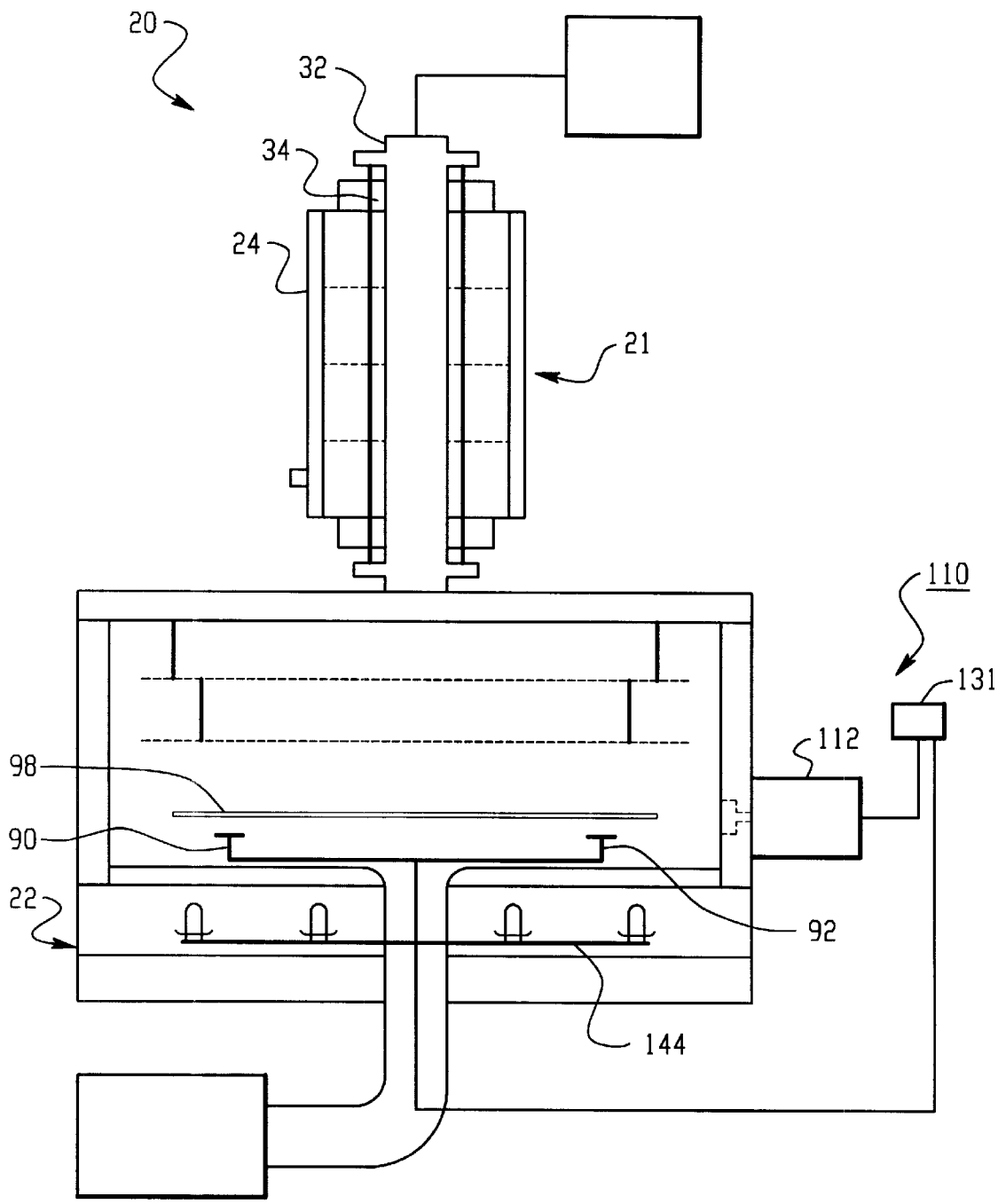
FIG. 4 is a front section view of a microwave plasma asher.
Figure 5:
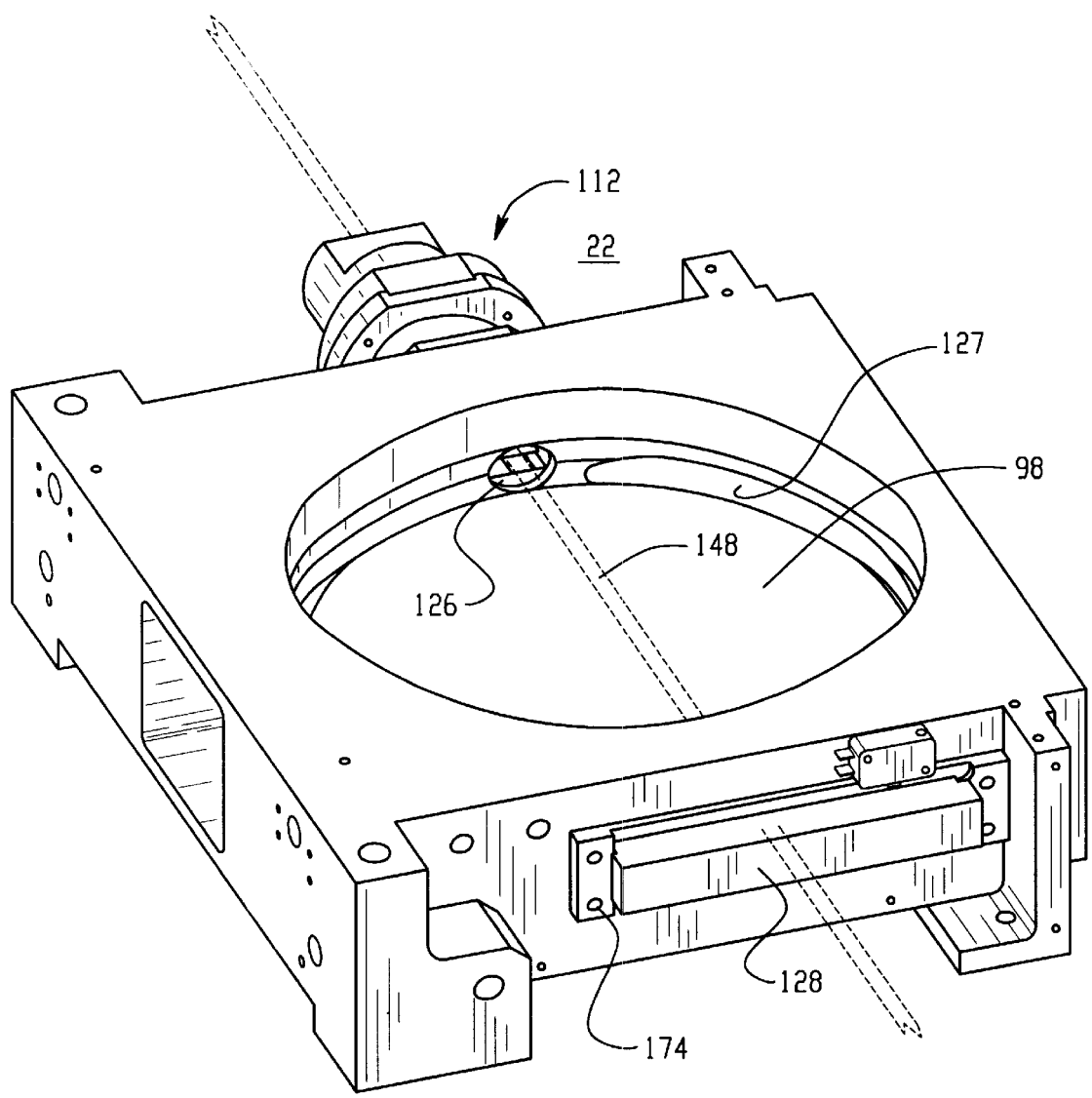
FIG. 5 is a schematic front elevational view of a process chamber of the microwave plasma asher.
Figure 6:
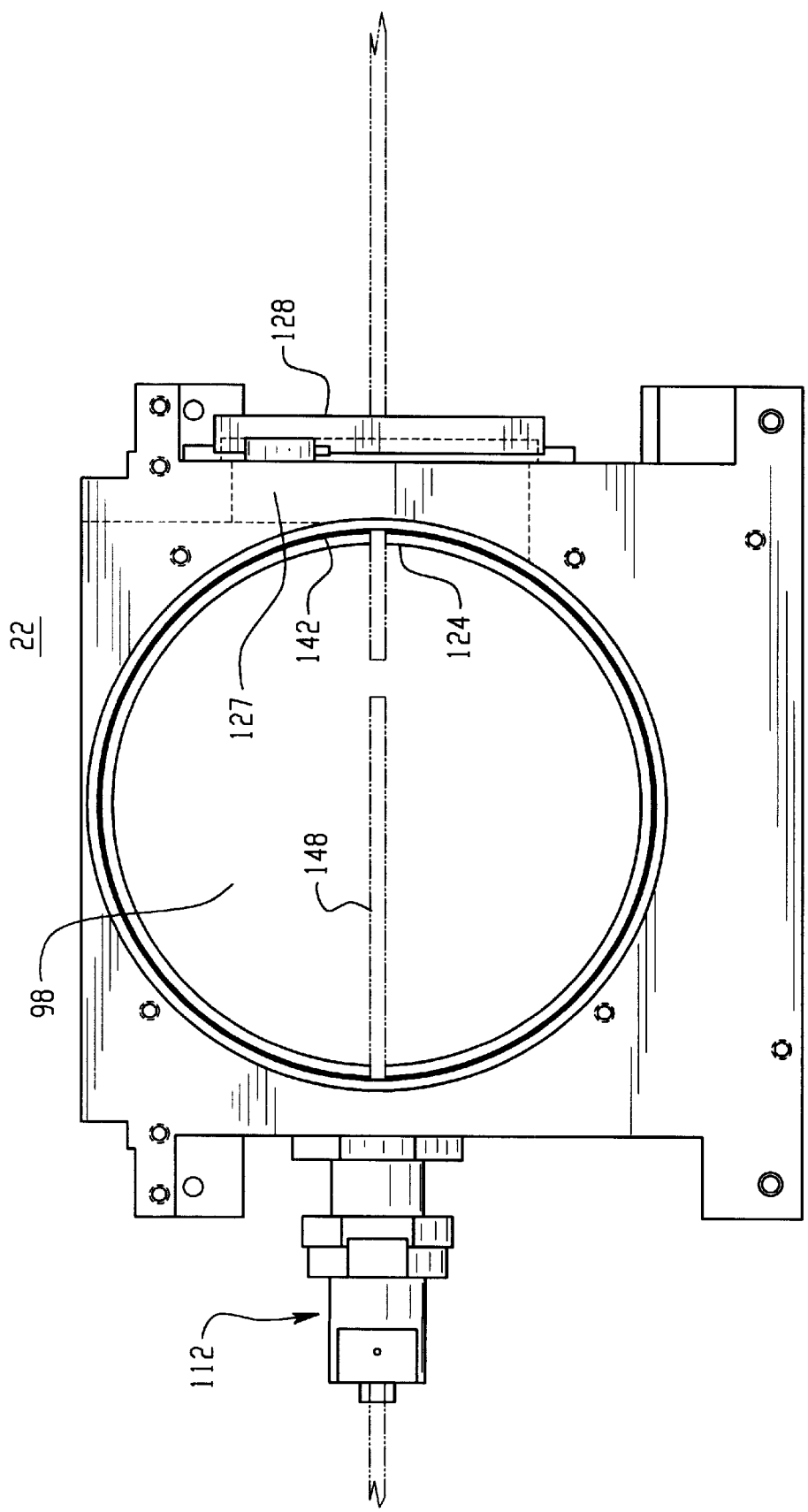
FIG. 6 is a plan view of a process chamber of the microwave plasma asher.
Figure 7:
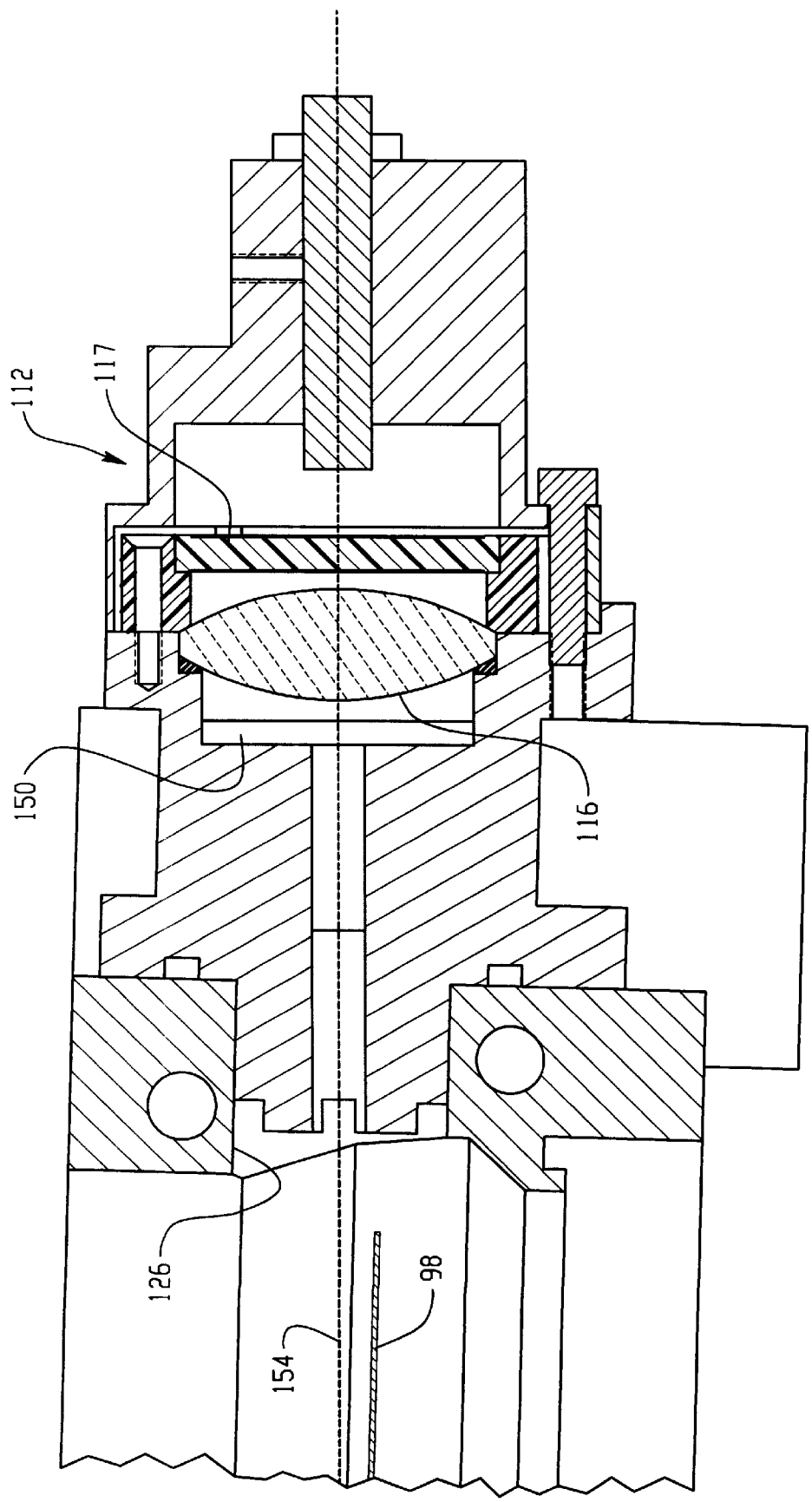
FIG. 7 is an enlarged sectional view of a portion of the process chamber including an optics port attached to the process chamber.
Figure 8:
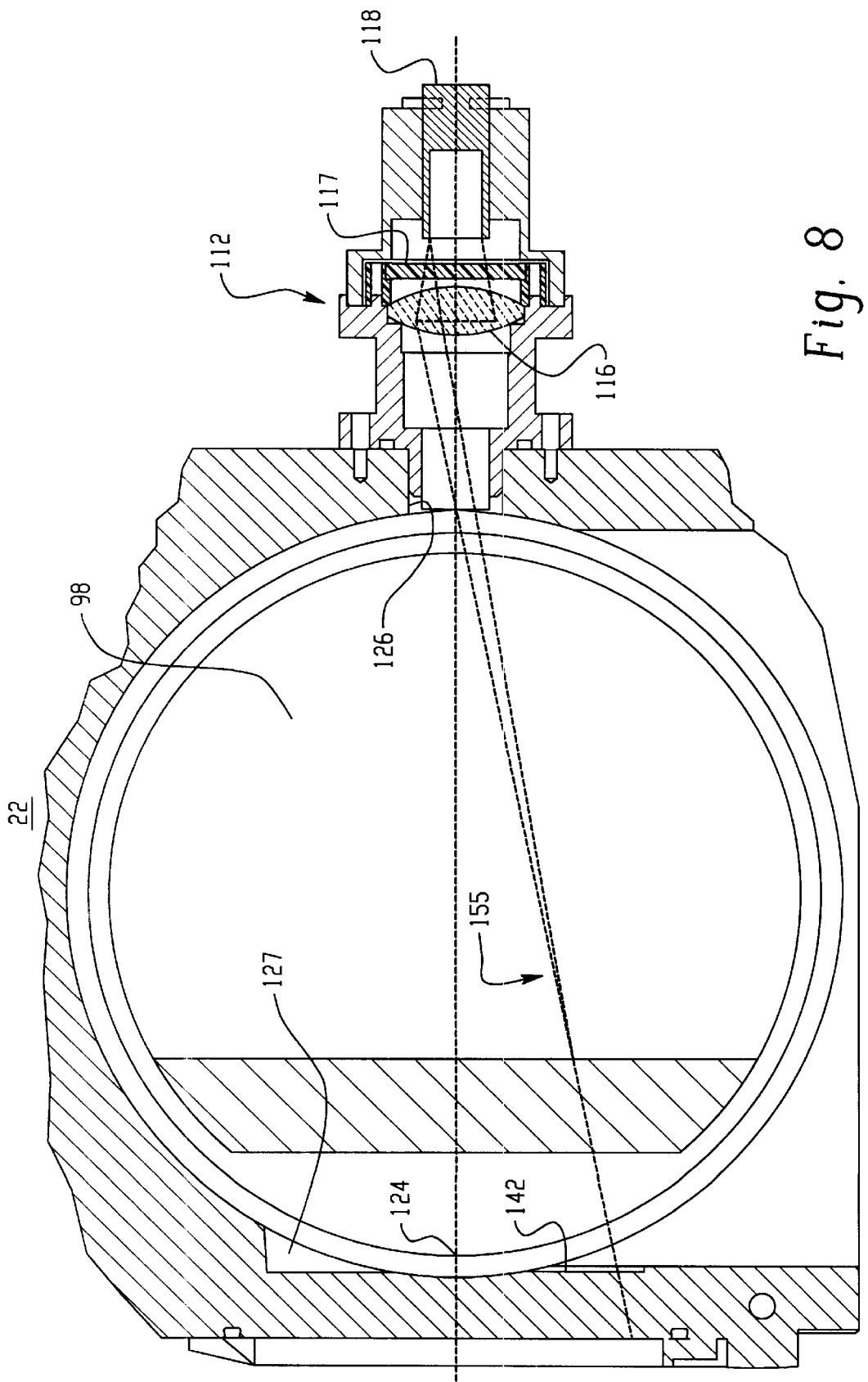
FIG. 8 is an sectional view of a process chamber including an optics port attached to the process chamber.
Figure 9:
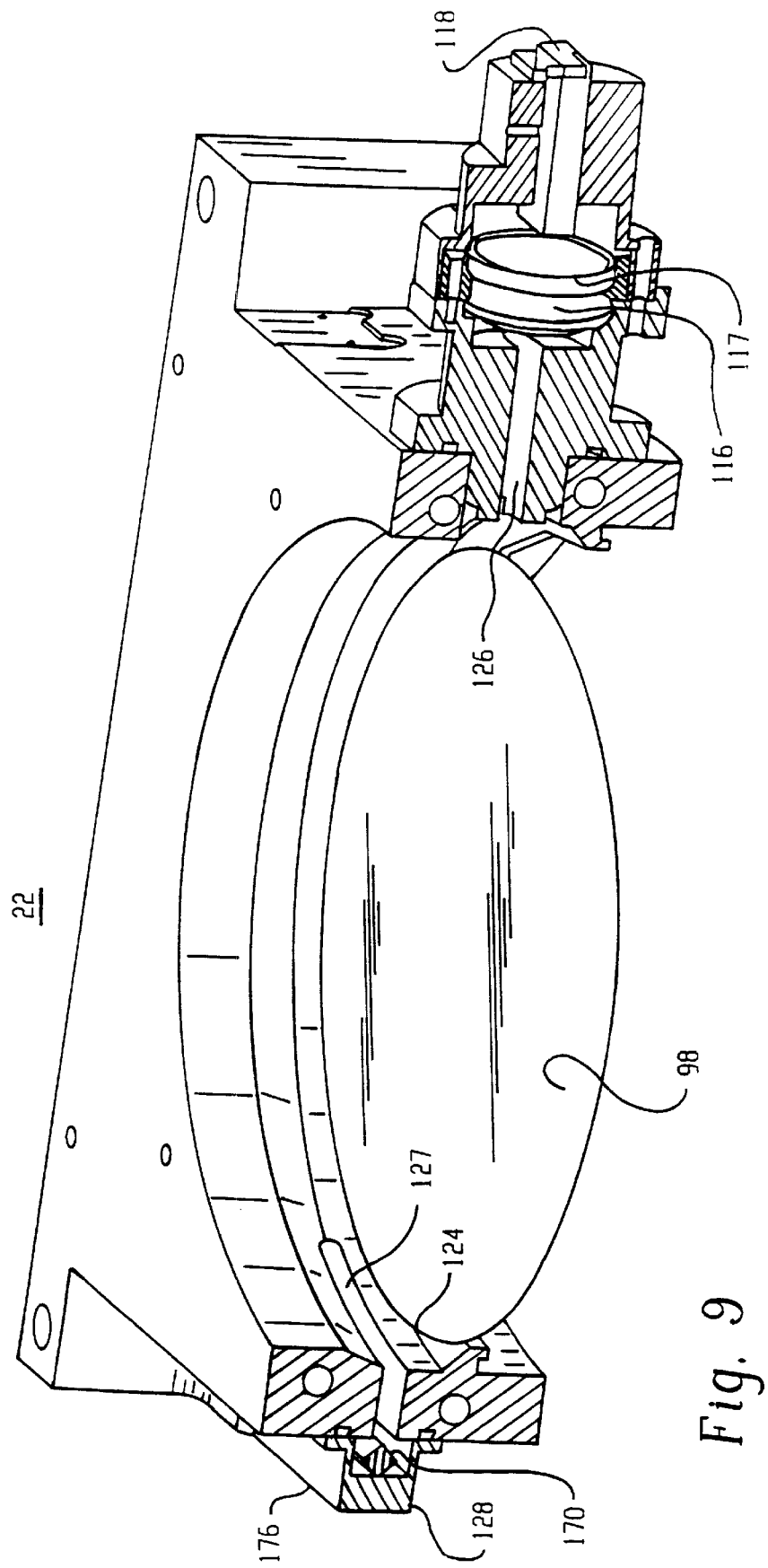
FIG. 9 is a front sectional view of a process chamber having an optics port and a viewing dump.

Referring now to FIGS. 3 and 4 in particular, there is depicted a microwave plasma asher which is generally designated by reference numeral 20 and is suitable for practicing a method of photoresist and/or post etch residue removal by treatment with a plasma. The illustrated plasma asher 20 includes a plasma generating chamber 21 and a plasma reaction chamber 22. The plasma generating chamber includes a microwave enclosure 24. The microwave enclosure is a rectangular box which is partitioned into lengthwise sections having plasma tube 32 passing there through. Each partition has an opening through which the plasma tube passes. Each section is fed with microwave energy. Thus, each section appears to be a relatively short cavity to the incoming microwave energy, promoting the formation of modes having azithumal and axial uniformity. Outer tube 34 surrounds the plasma tube inside the cavity. The outer tube is slightly separated from the plasma tube and air under positive pressure is fed between the two tubes to provide effective cooling of the plasma tube. Tube 34 is preferably made of sapphire. Other plasma tube materials such as quartz or alumina coated quartz can be used.

An iris plate covers the open side of the microwave structure and is effective to feed microwave energy into adjacent sections. The plate is a flat metallic pate having irises, through which the microwave energy is fed.

Microwave traps 46 and 48 are provided at the ends to prevent microwave transmission. Such traps may be of the type disclosed in U.S. Pat. No. 5,498,308, which is incorporated herein by reference. Air seals/directional feeders are provided for admitting cooling air and feeding it to the space between the concentric tubes.

Magnetron 56 provides microwave power which is fed through coupler 58 to a waveguide supplying $TE_{10}$ mode, having mutually perpendicular sections 60 and 62. The length of waveguide section 62 is adjustable with moveable plunger. At the bottom plate of waveguide section 62 is an iris plate, which couples microwave energy into partitioned microwave structure 24, through which the plasma tube 32 extends; thus a plasma is excited in the gas flowing through the plasma tube.

Referring again to FIG. 3, it is seen that end cap 70 abuts microwave trap 48, and fitting 74 having a central orifice for admitting gas to the plasma tube extends into the end cap. The gas supply is regulated by an external flow box (not shown).

The plasma tube is supported at this end by "o" ring in the end cap. The outer tube 34 is supported at its ends by abutment against microwave traps 46 and 48. A spacer is present to provide the proper spacing in relation to the process chamber. The other end of the plasma tube is located in end member 78, and has an orifice for emitting gas into the process chamber.

The plasma reaction chamber 22 includes wafer support pins 90 and 92, which support a wafer 98 to be processed. A chuck (not shown) may alternatively be used. Heating may be accomplished by an array of tungsten halogen lamps 144 positioned below the wafer. Preferably, the substrate is heated from about 80° C. to about 350° C. during ashing. More preferably, the substrate is stepwise heated by incrementally increasing the temperature. Heating has been found to increase the reaction rate of the plasma with the photoresist and/or post etch residues and consequently, increase throughput. One or more baffle plates may be present above the wafer to promote even distribution of the plasma to the surface. Additionally, the reaction chamber also includes an optical detection system 110. The optical detection system 110 optically detects an emission peak having a particular wavelength range that corresponds to the reaction by-product between the plasma and the photoresist.

FIG. 3 depicts a section of an exterior view of the plasma asher 20. The reference numerals in FIG. 4 correspond to those, which are used in the other Figures.

Preferably, the microwave enclosure 24 is dimensioned to support the rectangular $TM_{110}$ mode and the enclosure 24 may have a square cross section. The dimensions of the cross sections are such that the $TM_{110}$ mode is resonant. The length of each section is less than $\lambda_g/2$ where $\lambda_g$ is the guide length within the cavity of the $TE_{104}$ mode.

In operation, the semiconductor wafer 98 with photoresist and/or post etch residues thereon is placed into the reaction chamber 22 on wafer support pins 90 and 92. The wafer is preferably heated to accelerate the reaction of the photoresist and/or post etch residues with the plasma. The pressure within the reaction chamber is reduced. Preferably the pressure is maintained between about 1 torr to about 5 torr. A wafer treatment gas, such as, an excitable gas mixture of the hydrogen bearing gas and the fluorine bearing gas is fed into plasma tube 32 of the plasma generating chamber 21 via a gas inlet. The fluorine bearing gas is preferably less than 10 percent of the total gas composition. Each section is fed with microwave energy to excite a plasma in the plasma tube, which plasma is comprised of electrically neutral and charged particles. The charged particles are selectively removed prior to the plasma entering the reaction chamber. The excited or energetic atoms of fluorine (atomic fluorine) and hydrogen (atomic hydrogen) are fed into the reaction chamber and react with the photoresist and/or post etch residue.

A reaction by-product evolves and is monitored optically by the optical detection system 110. The reaction by-product gas is continuously swept away by a gas sweep within the reaction chamber. An optical detection system 110 (FIGS. 1 and 2) detects the emission peak of by-product. Once the emission peak reaches a lower threshold the removal of photoresist and/or post etch residues is complete and the plasma is turned off. Alternatively, the plasma may be run for a predetermined time. This has been found to be particularly useful for removing post etch residues from the substrate wherein the photoresist remaining after etch is minimal. It has been found that the emission peak is not easily detected if a sufficient quantity of photoresist is not present. It is believed that a detectable emission peak is primarily derived from the reaction between the plasma and the photoresist. The vacuum is then released and the processed wafers are removed from the reaction chamber. Once the wafer is withdrawn, a deionized water rinse is then used to remove any remaining residue on the stripped wafer.

One exemplary embodiment of the invention is directed to a wafer processing system such as a plasma asher 20 having a plasma reaction chamber 22, a plasma source 21, and an optics monitoring system 112. The wafer reaction chamber 22 includes a support having pins 90, 92 for positioning a wafer within an interior region of the reaction chamber 22. The plasma source 21 routes wafer treatment material into the reaction chamber 22 and removes a coating from an exposed surface 136 of the wafer 98. The monitoring system 112 has receiving optics 140 having a lens 116 focused at a location on or slightly above the surface of the wafer. The lens 116 is mounted to the reaction chamber 22 for monitoring concentrations of a reactant by-product of the coating and the wafer treatment material.

In the exemplary embodiment, the lens 116 transmits light from the reaction chamber 22 to fiber optic cables configured so that individual fiber optic fibers are in a linear array 118. A typical array may have 600.010 inch diameter fibers. Ideally, the linear array would be dispersed into a fan shape or arranged to view light originating from regions spaced about the entire surface of the wafer. The lens 116 may be a bi-convex lens positioned outside the chamber or within a recessed port 126 in the chamber. The radius of curvature of the lens 116 is the same on both sides and in the exemplary embodiment of the invention the lens is 1.5 inches in diameter and has a 29.8 mm radius of curvature. The lens may be made by CVI Laser Corp. or Esco Products. A low pass filter 117 is positioned between the lens and the fiber optic fibers to intercept unwanted light of wavelengths other than the wavelength of the by-product signal. The optical access port 126 in the process chamber wall should be rectangular shaped, which is wider than it is high. The optical access ports 126 should recess the optics to prevent them from becoming dirty or coated with by-product.

Figure 12A:
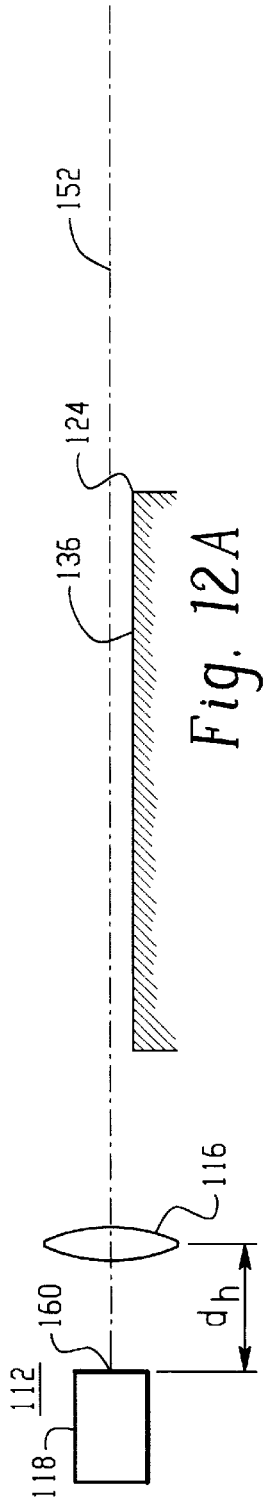
FIG. 12A is a schematic of optics having a line of action that extends above a wafer.

The preferred array of fiber optic fibers 138 of the optical detection system is a quartz fiber optic cable 138 coupled to a spectrometer 131 having an input slit 132. Light in the field of view of the optics monitoring system 112 passes through the lens 116 and into the array 118 of fiber optic fibers. The received light travels through the fiber optic fibers to the spectrometer input slit 132. After passing through the input slit 132, the light is separated into its wavelength components by a grating 133 inside the spectrometer 131. The spectrometer includes a charge coupled device which categorizes the signals so that the spectrometer can analyze each of the separated wavelength components of the light to determine the characteristics of the light from a line of sight 152 of the optics monitoring system 112. See FIG. 12A. Two suitable spectrometers are model # PC2000 spectrometer available from Ocean Optics, Inc and model # SD1024 spectrometer available from Verity Instruments, Inc.

A viewing dump port 127 on the far side of the reaction chamber 22, opposite the optics monitoring system 112, allows a viewing dump 128 to be mounted either recessed in the reaction chamber or outside the process chamber. The viewing dump port size, shape and location are such that all unwanted light, that could be emitted from or reflected off the far wall and enter the optics monitoring system, is allowed to enter the viewing dump port 127. The viewing dump 128 is sized to intercept any light which might enter the optics monitoring system 112.

Measurement of the signal emitted by the volatile by-product is optimized by careful selection of the focal point 130 of the optics monitoring system 112. The plasma 114 reacts with the surface 136 of the coating to form a volatile by-product, which emits a signal. A volatile by-product profile exists just above the wafer 98, which may be measured by optical emission spectroscopy (OES) to determine when the ashing is complete. The volatile by-product emission profile is concentrated near the wafer surface 136. The monitored volatile by-product signal is maximized by focusing the optics monitoring system 112 at a point near the surface, near the far edge 124 of the wafer and locating the optics monitoring system so that its entire line of sight 154 is in the concentrated volatile by-product profile. The resulting line-integral or line-of-sight averaging method, in addition to monitoring the area near the focal point, also samples chords above the wafer, extending from the lens 116 to the focal point 130 and from the focal point to the viewing dump port 127.

Figure 10:
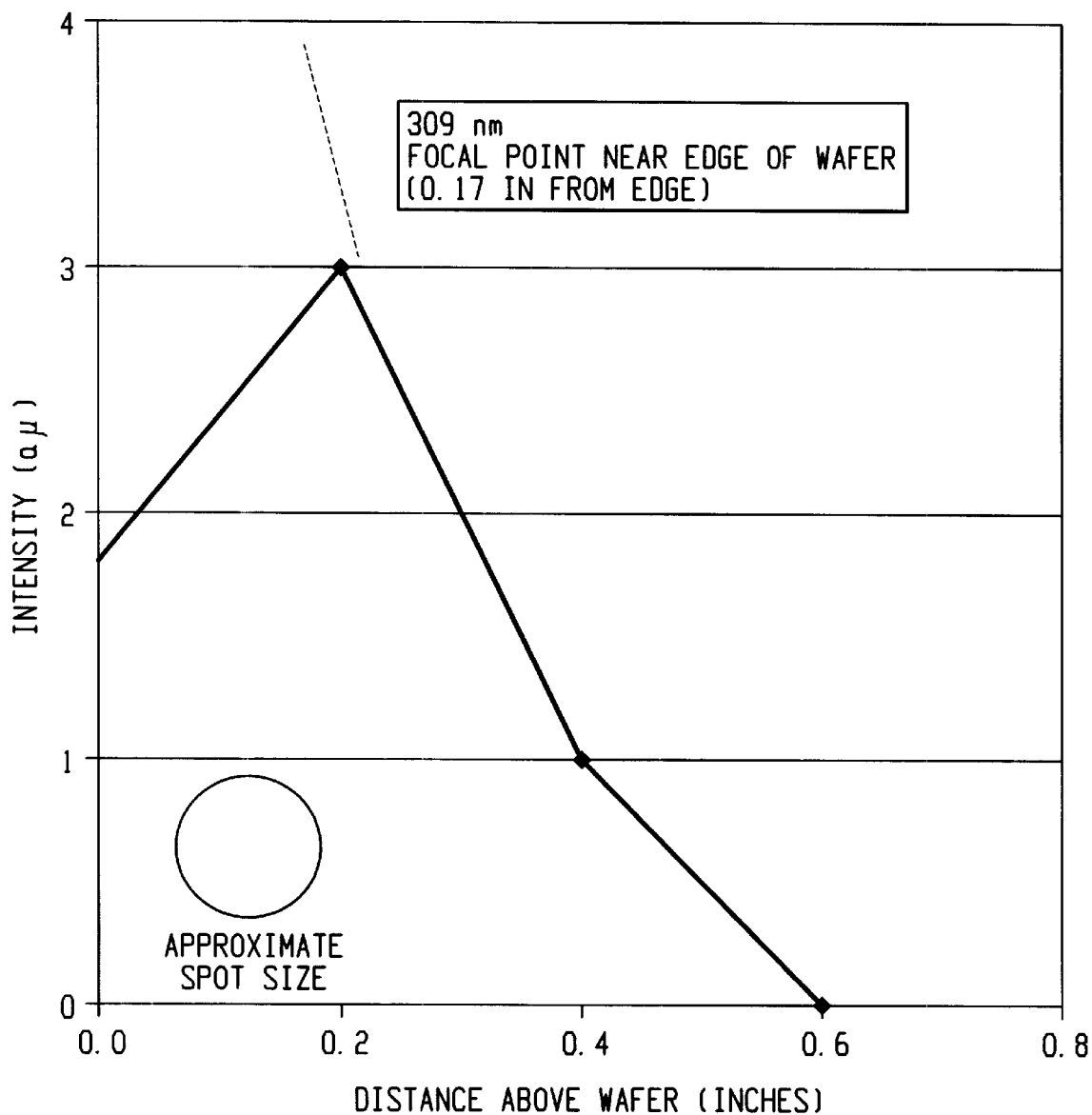
FIG. 10 is a chart which represents the relationship between distance above the wafer and intensity of signal of a particular wavelength light.
Figure 11:
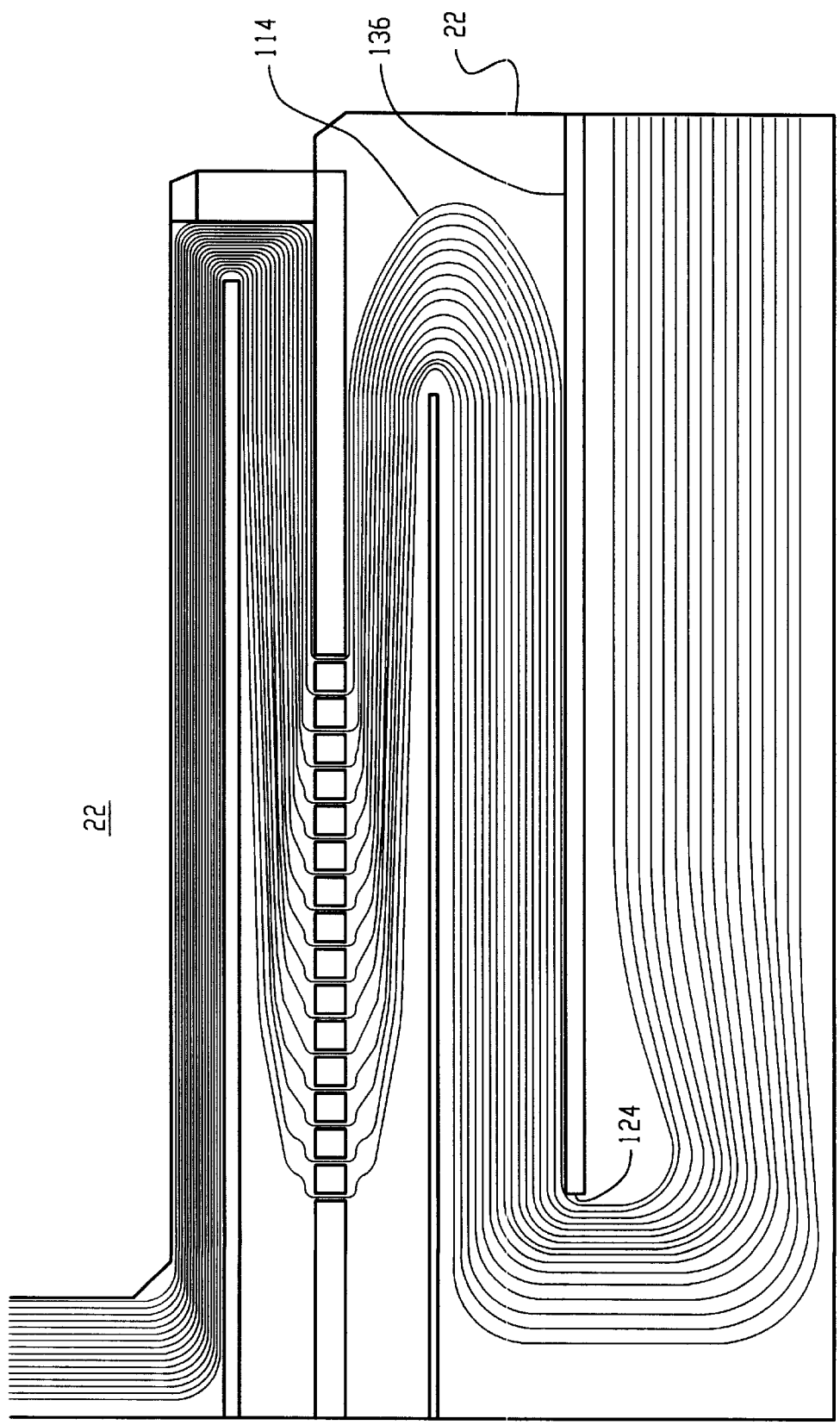
FIG. 11 is a schematic view of the microwave plasma asher, which depicts the flow of plasma within the process chamber.

FIG. 10 shows the intensity of a 309 nm line due to the signal emitted by the volatile by-product of the plasma and the coating. The intensity is greatly peaked just 0.1 inches above the wafer 98. The viscous laminar flow characteristic of the plasma flow depicted in FIG. 11 leads to smooth flow contours which keeps the by-product of the coating and plasma confined to a layer just above the wafer surface 136, peaked near the surface. The by-product profile is not peaked directly on the surface, but at approximately 0.1 inches above the surface, due to the fact that the line of sight for the viewing optics integrates along a path above the wafer. By placing and focusing the optics monitoring system, the by product produced near the focal point, as well as by-product along the entire line of sight of the optical monitoring system are monitored.

The signal intensity is not only dependent on the focal point 130 location above the wafer 98, but also path length above the wafer. Since the OES is an integral measurement along some path length, the signal intensity increases as the path length 156 increases.

Figure 12B:
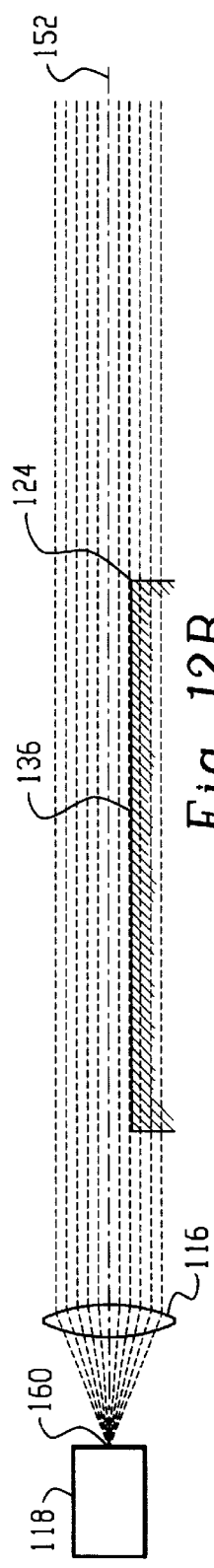
FIG. 12B is a schematic of unfocussed optics and a wafer.
Figure 12C:
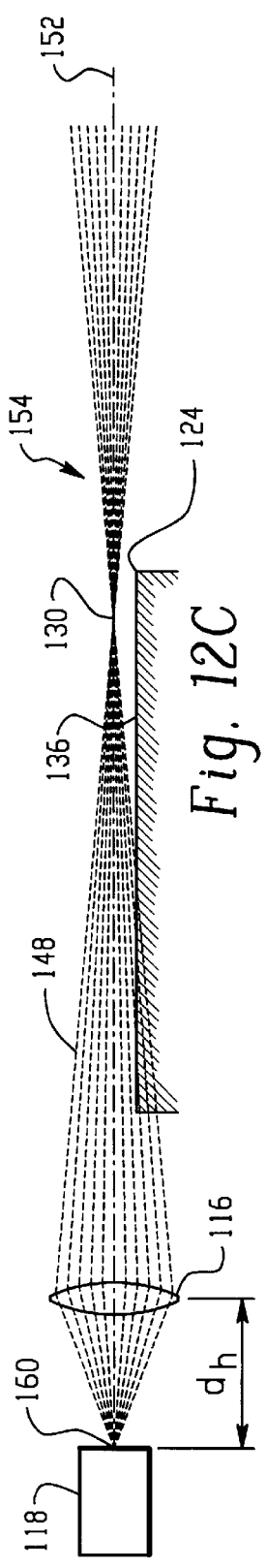
FIG. 12C is a schematic of optics focused for viewing a region above the surface of a wafer.
Figure 12D:
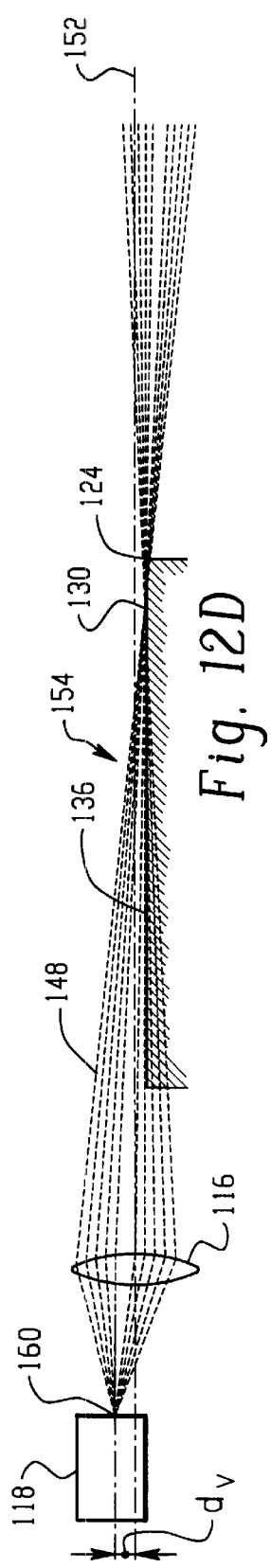
FIG. 12D is a schematic of optics focussed at the surface of a wafer.

FIGS. 12B–12D show how an originally unfocussed optics monitoring system 112 can be optimized by properly locating the fiber optic fibers 138 with respect to the lens 116. FIG. 12B depicts an unfocused optics monitoring system with the viewing ends 160 of the fiber optic fibers 118 located at an unfocussed position. A focal point 130 is defined by adjusting a horizontal distance $d_h$ between lens and the fiber optic fiber ends 160, as shown in FIG. 12C. The distance from the focal point 130 to the lens 116 can be adjusted by changing the horizontal distance $d_h$. Referring to FIG. 12D, the focal point 130 can be positioned closer to the wafer surface 136 by moving the fiber optic fiber ends 160 a vertical distance $d_v$ from the viewing beam axis 152 of the lens 116. The optimal focal point is at a location just above the wafer at the far side of the wafer. By optimizing the focal point 130 of the optics monitoring system, the emission signal is nearly doubled.

A linear array 118 of fiber optic fibers 138 within a fiber optic cable allows for a more complete sampling of the wafer 98. The present invention uses a linear array 118 of fiber optic fibers to view the region of the wafer. For example, a single layer linear array using the 60 fiber optic fibers, nominally 9–10 micron diameter each fiber optic fiber can be made from an original circular bundle of such fiber optic fibers. Other linear arrays may be constructed using N rows and M columns of fiber optic fibers, creating a rectangular type bundle. A rectangular type bundle concentrates the receiving optical fibers at a position above the wafer at which the maximum emission strength occurs.

A circular array of fiber optic fibers views a large circular pattern within the reaction chamber 22. In the case of the round bundle of fiber optic fibers, the viewing optics views not only the wafer 98 and the region above the wafer, but also the lower side of a baffle plate shown in FIG. 11. Using a circular bundle of fiber optic fibers has the consequence of diluting the signal strength by not viewing the regions in the reaction chamber 22 from which the by-product signal is most intense. The circular bundle also views noise and background sources of light, which ultimately make the processing of the signals more difficult.

The use of a linear array 118 of fiber optic fibers has advantages in addition to viewing the desired by-product signal where it is concentrated. The linear array of fiber optic fibers sample a larger area of the wafer and therefore provide increased assurance that there is complete removal of coating, assuring more reproducible identification of the completion of the etching or ashing. The shape of the field-of-view of the linear array of fiber optic fibers is compatible with the viewing dump 128.

An additional advantage of a linear fiber optic fiber array is that the vertical extent required for the optics monitoring system ports 126 is greatly reduced. When a viewing dump 128 is used in conjunction with a linear array of fiber optic fibers, the vertical extent of the viewing dump port 127 is also reduced. The reduced size of the ports results in a reduced perturbation to the internal geometry of the plasma reaction chamber 22. Possible effects on the dynamic flow of plasma through the reaction chamber 22 are reduced, resulting in an improved uniformity of the ashing process of the surface 136 of the wafer. The elongated port geometry is perpendicular to the plasma flow. The short elongated geometry of the ports also results in a more symmetric plasma flow, since the extent of the port in the direction of the plasma flow is small.

In the exemplary embodiment, a fan-shaped distribution of fiber optic fibers 138 may be used in place of the linear array to further enhance the sampling of the wafer. Instead of a parallel configuration of fiber optic fibers, the fiber optic fibers can be spread into a fan-shaped array so that more of the area of concentration of by-product signal is sampled. If the array is correctly fanned out and has an appropriate number of fiber optic fibers, the entire two-dimensional area of the wafer surface 136 can be sampled. Assurance of complete coating removal is obtained by sampling a majority of the wafer surface 136. Furthermore since the wafer 98 often ashes in an axially symmetric fashion, the fan-shaped array of fiber optic fibers will be sensitive to situations in which the outer edge 124 of the wafer 98 ashes last. Conventional methods of optically viewing the reaction chamber 22 are very insensitive to situations where the edge of the wafer ashes last.

By sampling a larger area of the wafer an increased assurance of complete removal of the coating is obtained. The shape of the field-of-view of a fan shaped array of fiber optic fibers is also compatible with a viewing dump.

In another embodiment of the invention, true two-dimensional sampling of the wafer surface may be obtained by configuring the array of fiber optic fibers to sample the wafer discretely. The array 118 of fiber optic fibers can be arranged to focus on and sample discrete locations on the wafer 98, rather than utilizing the line-integral for line-of-sight averaging method of surveying different chords above the wafer. True two dimensional sampling can be accomplished by determining the exact position required for the receiving end of each fiber optic fiber to sample a uniformly distributed array off points covering the two-dimensional surface of the wafer. The correct position of each fiber optic fiber may be maintained by a holding block. The holding block is machined to accept the fiber optic fibers, with a narrow hole drilled to position each fiber optic fiber corresponding to the fiber optic fiber's appropriate angle and distance from the lens 116. By employing true two-dimensional sampling, the fibers sample a larger representative area of the wafer and therefore provide increased assurance that there is more complete removal of coating, which assures more reproducible identification of the end of the ashing or etching process. The shape of the field-of-view of an array of fiber optic fibers, arranged for two-dimensional sampling, is compatible with the use of a viewing dump.

In the exemplary embodiment, a low pass filter 117 prevents light of undesirable wavelengths from entering the fiber optic fibers 138. The wavelengths of the light emitted by the by-product of the plasma and the coating ranges from approximately 300 nm to 450 nm. The radiant heating lamps 144, depending on power level, can produce light with wavelengths ranging from slightly below 300 nm to well above the 1000 nm range. The preferred low pass filter 117 only allows light in the 300–450 nm range to pass through. The low pass filter 117 may be a broad-band low-pass filter. A low-pass filter that prevents light with wavelengths greater that 450 nm from passing through may be used, since there is very little emission below 300 nm. The low pass filter prevents the bulk of the unwanted lamp light from entering the spectrometer 131 and potentially scattering into the detector at the output of the spectrometer 131. The low pass filter allows the lower-amplitude light with wavelengths of the by-product light to enter the spectrometer and be processed.

The low pass filter 117 may be a thin, approximately ¼ inch thick, glass disk with a diameter of approximately inch. The low pass filter is inserted into the light path just before the fiber optic fibers leading to the spectrometer 131. The low pass filter may also be inserted just before the spectrometer, or just before the lens 116.

The low pass filter 117 is created by depositing numerous thin film layers on the surface of a glass disk to obtain the desired transmission and reflectance properties. For example, a BG3 glass substrate of glass may be covered by approximately 70 layers of dielectric and metal films to achieve the desired bandwidth.

In the exemplary embodiment, a viewing dump 128 is used to reduce background and signal noise. The viewing dump 128 prevents light emitted from the far wall 142 and reflected off the far wall 142 of the plasma reaction chamber 22 from entering the optics monitoring system. Even if the optics monitoring system 112 is focused on the wafer surface 136, light rays may still originate from the far wall 142, pass through the focal point 130, and terminate in the fiber optic fibers 138. Unwanted light may originate from the wall if the wall is slightly covered with coating and coating by-products resulting from previous or present etching and ashing processes. Unwanted light may also be reflected off the wall and into the field-of-view of the optics monitoring system. Unwanted, reflected light is particularly abundant in radiantly heated systems, which utilize lamps to heat the wafer 98.

Light emitted by and reflected off the chamber wall opposite the optics monitoring system 112 reduces the signal-to-background, and thereby increases the demands on the hardware and software processing systems to process a larger dynamic range of signals with high amplitude resolution. FIG. (14) shows the time evolution of the 309 nm signal during an entire process for a first process chamber and the process chamber of the current invention. The plot of the signal monitored in first chamber is indicated as 162 and the signal monitored in the inventive chamber is indicated as 166. The first high emission signal levels are due to the lamp light during the high lamp power ramp phase, and the second (not as high) high levels are due to the ashing during the microwave operation phase. Residual unwanted light signals can be seen after approximately 100 seconds. The residual signal is either due to the lamps 144, ashing signal originating from the wall 142, or plasma light. FIG. (14) shows that for points focussed near the far edge of the wafer, there is a residual signal after the ashing process is complete due to signals emanating from the far wall 142 of the process chamber.

A substantial amount of lamp light is diffusely scattered off the far wall 142 of the process chamber 22. Although the percentage of incident light on the far wall 142 that gets scattered into the field of view is small, the lamp light is so intense that a significant amount of lamp light may be viewed by the optics and measured by the spectrometer 131. During operation of the asher, the coating from the wafer 98 may be deposited on the far wall 142. Subsequent ashing processes remove the deposits on the wall as well as the coating on the wafer, causing a by-product signal to be emitted from the far wall. Plasma reacting with coating on the far wall causes the wall reflectivity to change over time. The viewing dump prevents most of the light emitted by and reflected off the far wall 142, which would have otherwise been integrated by the optics monitoring system, from entering the field of view 155.

The viewing dump 128 prevents light scattered off the far wall 142 from entering the field of view 155 of the optics 140. The viewing dump works by removing the far wall locally so that no coating is deposited on the far wall, in an area that can be viewed by the optics monitoring system and capturing light that enters the viewing dump 142 so that it is not viewed by the optics monitoring system 112. Depending on the design of the remaining portion of the viewing dump 142, the port 127 or slot removed from the far wall may or may not lead to the outside of the chamber. Preferably, the viewing dump port 127 does not have complicated geometry where dirt and coating can accumulate.

By using a viewing dump 128, the lamplight, which enters the optics monitoring system is reduced to 1.6% of its original value. The dump 128 is a broadband device, which eliminates broadband lamp and plasma light to improve the signal to background for the entire charge coupled device detector or other spectrometer used. The viewing dump 128 reduces demands on the hardware and software, making extraction of the relevant signals easier. The viewing dump 128 serves as a "black hole" for the optics monitoring system on the other side of the wafer 98.

The viewing dump 128 can be made from any material which prevents light from emanating from the far wall 142. One viewing dump is a stack of razor blades welded together. Standard utility razor blades, made from stainless steel may be used to produce an effective viewing dump 128 with a large angle of effectiveness for the incoming light. The blades are virgin stainless steel, and there is no need to coat or paint the blades. The viewing dump 128 made of razor blades presents a light absorbing surface. The viewing dump 128 appears black when viewed from angles, ranging from perpendicular to the front of the viewing dump to angles exceeding 60 degrees from perpendicular. Remaining unwanted light signal, not absorbed by the viewing dump 128, is due to light scattering from the port 126 holding the window and lens 116 or from light scattered diffusely off of the surface of the wafer 98.

In the exemplary embodiment, the viewing dump 128 comprises a slot or port 127 in the far wall of the reaction chamber 22, a black box 176 cover and a reflective light capturing device 170, which may be diamond shaped and reflective. In the exemplary embodiment, one or more of the viewing dump components are anodized. Preferably, the viewing dump components are anodized to a dark color, such as black. Light, which could enter the line of sight of the optics monitoring system 112, passes through the port or slot into the black box 176. The light, once in the viewing dump is prevented from reentering the reaction chamber 22 by the light capturing device 170. The exemplary viewing dump may also have a black window in front of the vie wing dump port 127 and a black over 180. The window and the cover prevent coating from adhering to the other viewing dump components. The viewing dump may also be any combination of windows with black covers, black covers, black dump boxes, black dump box with light capturing devices, windows with razor blade dumps, and razor blade dumps.

It should be apparent to those skilled in the art that there are a number of options for installing the viewing dump 128. One preferred method is to install the viewing dump 128 inside the reaction chamber, within the confines of a viewing dump port 127 or port extension. Another option is to install the dump 128 outside of the chamber, with a window between the viewing dump and the reaction chamber 22. Mounting the dump 128 on the outside of the chamber has the advantage of keeping the dump clean and not allowing it to participate in any reactions. One of the advantages of the razor blade type of viewing dump is that the surface condition of the dump blades does not affect the performance of the dump 128. Even if the dump becomes dirty or covered with coating or coating residues, the light absorption properties of the dump will not degrade. The viewing dump 128, made from reflective virgin stainless steel, becomes more effective as dirt or corrosion reduces its reflectivity.

The preferred viewing dump port 127 or slot is small to minimize flow disturbance of the plasma. A slot, which is compatible with the linear fiber optic array 118, such as, a slot with a height, which is two times the height of the viewing beam 148 at the far wall 142, may be,used. A slot, which is twice as high as the viewing beam 148 at the far wall 142, allows for a margin of error. For example a viewing dump port 127 with a height of ¼ inches may be used for an array of fibers that views a ⅛ high band at the far wall. A larger slot will result in marginally better optical results, but does not justify the additional disturbance of the plasma. The viewing dump, which utilizes a slotted port, allows the optical components of the viewing dump to maintain deposition free surfaces for a longer period of time.

In the exemplary embodiment, a bi-convex type lens is used to couple and focus the light from the process chamber into the fiber optic fibers or directly into the spectrometer. The outermost surface of the optics may be a window in front of the lens, or the lens itself, if a protective window is not used. The lens 116 or window 150, behind which the lens sits is recessed away from the inside of the process chamber 22. When the outer surface of the optics 140 becomes dirty, light emitted by the by-product is prevented from entering the optics and unwanted lamp light is defracted or deflected off the dirt or coating into the optics, resulting in decreased signal to background and signal to noise ratios. The recessed lens or window, is much less prone to becoming covered with dirt or coating. Further, a narrow port, through which the optics 140 view the process chamber, is used to reduce the likelihood that coating and other contaminants will cover the outermost optical surface of the optics monitoring system 112. Recessing the outermost surface of the optics 140 substantially reduces the amount of coating which adheres to the window or lens. The signal to noise and signal to background ratios are increased by recessing the optics 140, because the desired by product light is allowed to enter the optics, while unwanted lamp light is not detracted in. Additionally, the time between required cleaning of the outer lens or window is reduced substantially by recessing the optics.

A cylindrical lens can be employed in place of a bi-convex lens to spread the line of sight horizontally across the wafer 98 so that more of the area of concentration above the wafer is sampled. Use of a cylindrical increases the reproducibility of the endpoint determination. The cylindrical lens may be employed with either a circular bundle of fiber optic fibers or a linear array of fiber optic fibers.

The exemplary embodiment of the invention, uses a polarizer 122 in conjunction with the lens 116 to reduce background and noise signals. At the relevant wavelengths (e.g., 309 nm) for the etching and ashing processes, a thin film polarizer usually has relatively large absorption, resulting in reduced signal strengths. However, if there is an adequate signal so that part of the signal can be sacrificed, then a thin film polarizer can be used. If the polarizer 122 is a thin film polarizer, it may be inserted between the lens and the window. If signal strength cannot be sacrificed, then a different type of polarizer may be used, which consumes more space along the optical, axis, but does not reduce the signal as significantly. For example, broadband polarizing beam splitter cubes or other components utilizing blocks may be used. If the polarizer 122 is large, it could be positioned between the lens 116 and the array of fiber optic fibers, 118.

In the exemplary embodiment, viewing optics 140 are focussed on the wafer surface. By focussing the optics 140 on the surface of the wafer at an angle such that the entire line of sight 154 is in the concentrated area of the by-product, signal strength is improved. The distance between the line of sight of the optics and the wafer surface which is acceptable depends on a number of parameters, such as the minimum spot size of the focal point 130, the angle of viewing with respect to the plane of the wafer surface, the distance between the focal point 130 and the edge 124 of the wafer, the flow rate of the gas through the process chamber, and the particular process being performed.

Figure 14:
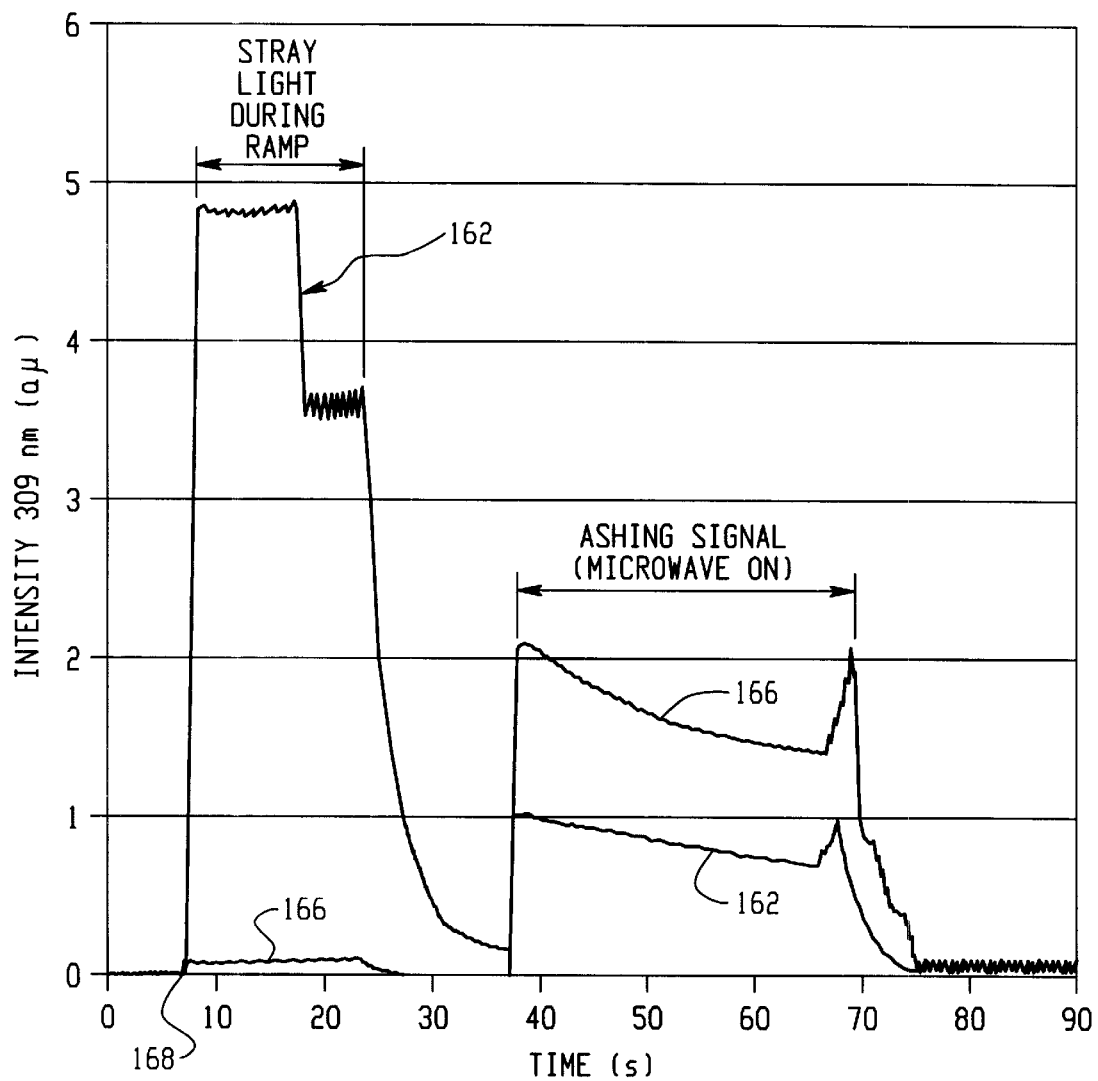
FIG. 14 is graph which represents the relationship between the intensity of 309 nm light and time for two different reaction chambers.
Figure 15:
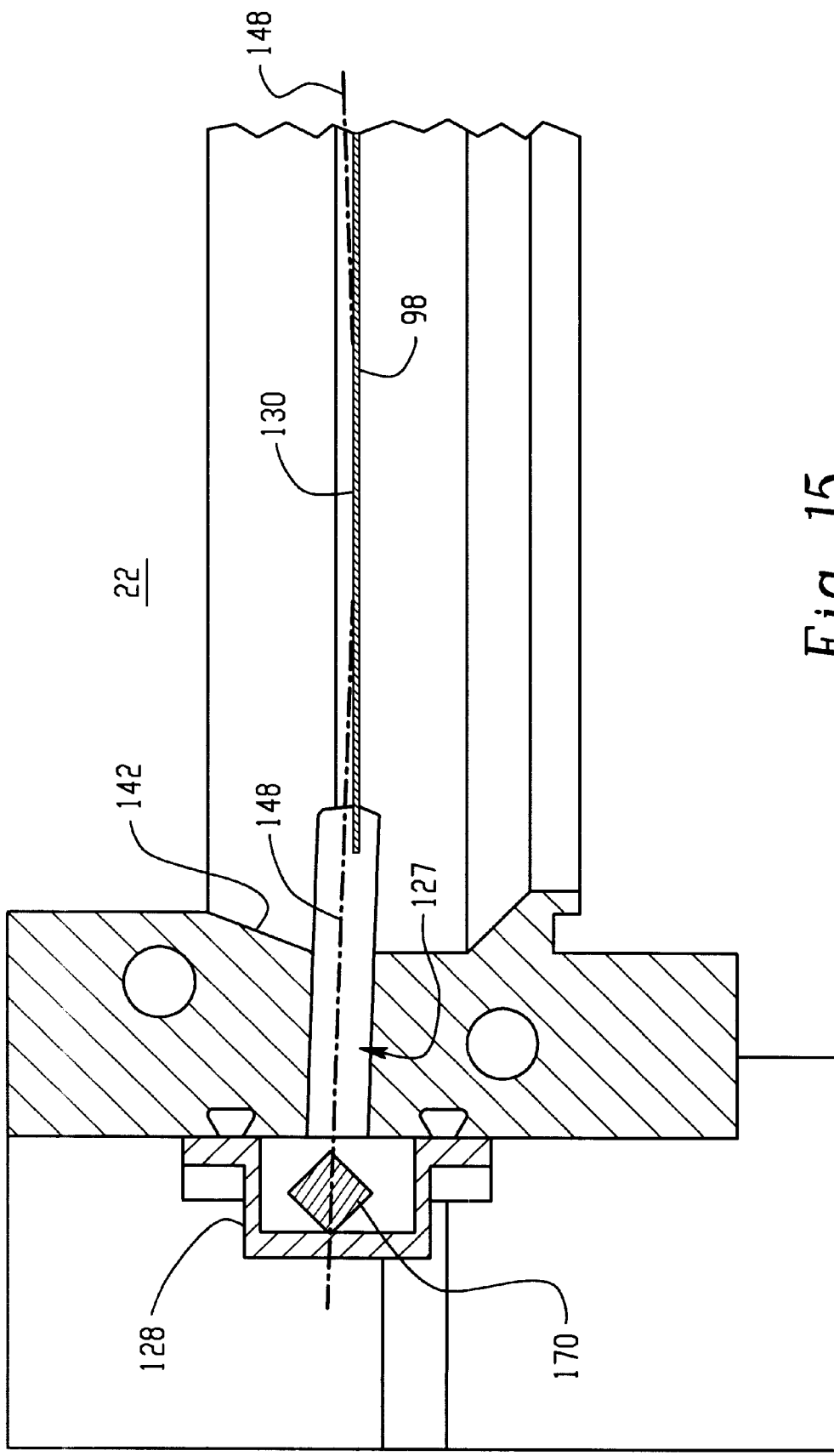
FIG. 15 is an enlarged perspective sectional view of a viewing dump.

Referring to FIG. 14, a graph of signal intensity, measured by the spectrometer, is plotted over the operational time of the asher. The prior art signal is labeled 162 and the inventive signal is labeled 166. The graph shows that the unwanted stray light, which is most prevalent during ramp is greatly reduced by implementation of the current invention. The graph also shows that the desired by-product signal is greatly increased by implementation of the present invention.

Referring to FIG. 10, for a typical focal spot size of 0.1 inch diameter, one achieves a strong by-product signal if the focal point is within 0.4 inch of the wafer surface. The peak intensity is obtained within 0.2 inch of the wafer surface. The signal decreases as the wafer surface is approached. The decrease in signal intensity near the surface is due to the fact that the viewing optics are viewing nearly tangential to the wafer surface and the optics are integrating along the tangential line-of-sight. By-products are swept along above the surface of the wafer, radially outward, by the laminar flow of plasma. The concentration of line-integrated by-product is higher slightly above the wafer surface due to the viscous drag of the laminar flow at the wafer surface.

Preferably, the optics monitoring system 112 views the wafer 98 from an angle corresponding to the Brewster angle for the material the wafer is made from. For typical wafer materials, such as silicon, the angle between the viewing optics and a focused region on the wafer surface would be 16.2 degrees. The optics monitoring system would ideally be focused on the wafer, surface 136 at a far side 124 of the wafer 98 relative to the optics monitoring system 112. The feasibility of viewing the wafer at the Brewster angle is dependant on the aspect ratio of the reaction chamber 22. For certain chambers, for example, the vertical dimension of the reaction chamber 22 may be too small to allow the lens 116 to focus on the far side of the wafer at the Brewster angle.

In the preferred embodiment, the light entering the optics monitoring system 112 is polarized to increase the signal to noise and signal to background ratios. The wafers 98 used in semiconductor processing tools are typically made of the dielectric materials, such as silicon. The properties of the dielectric material determines the angle at which incident light is reflected. The reflective properties depend on the polarization of the incoming light. This phenomena is applied to improve the signal-to-background of the optical detection system 110.

As endpoint is approached a thin layer of remaining coating is removed relatively quickly. Therefore, the only material that needs to be monitored with regard to reflective properties is the dielectric material of the wafer 98 itself. The dielectric constants of various coating materials do not need to be considered.

For typical silicon wafers, the reflectivity is fairly high. However, the reflected light can be polarized by adjusting the viewing angle to the Brewster angle $\theta_B$. For ac given material, the Brewster angle $\theta_B$ is defined as:

$$\theta_B = \tan^{-1}(n_2/n_1)$$

$\theta_B$ is the incident angle relative to the normal to the surface. $n_2$ is the index of refraction of the material from which the light is incident, essentially the vacuum of the process chamber. $n_1$ is the index of refraction of the material onto which the light is incident, the silicon or other wafer material. At the Brewster angle $\theta_B$, all light with polarization of the electric field which is in the plane of incidence is transmitted into the second material, with no reflected component. The plane of incidence is defined as the plane which contains both the incident and reflected or refracted rays of light.

In the one embodiment, the optics monitoring system views the wafer from the Brewster angle $\theta_B$. Any light reflected by the wafer material that is monitored by the optics monitoring system is composed of only one polarization. A polarizer 122 is included in the optics monitoring system 112 to remove the remaining polarized component of the reflected light. The wafer material will have removed one component of the light incident on the wafer, and the polarizer 122 removes the remaining component. At endpoint, when all of the coating is removed, no light is measured by the spectrometer, because the wafer viewed at the Brewster angle $\theta_B$ removes one component of the light reflected off the wafer and the polarizer removes the remaining component. While the polarizing system also reduces the desired signal from the by-product, the background is reduced by a greater magnitude, yielding an increased signal-to background ratio.

The calculated optimum angle for silicon wafers is approximately $\theta_B=73.8$ degrees, which translates into an angle of 16.2 degrees between the optics and the surface of the wafer, resulting in a 3.44-to-1 ratio of the distances between horizontal and vertical between the focal point 130 and the optics monitoring system 112. An aspect ratio of 3.44-to-1 is quite compatible with the construction of a typical reaction chamber 22.

Figure 13A:
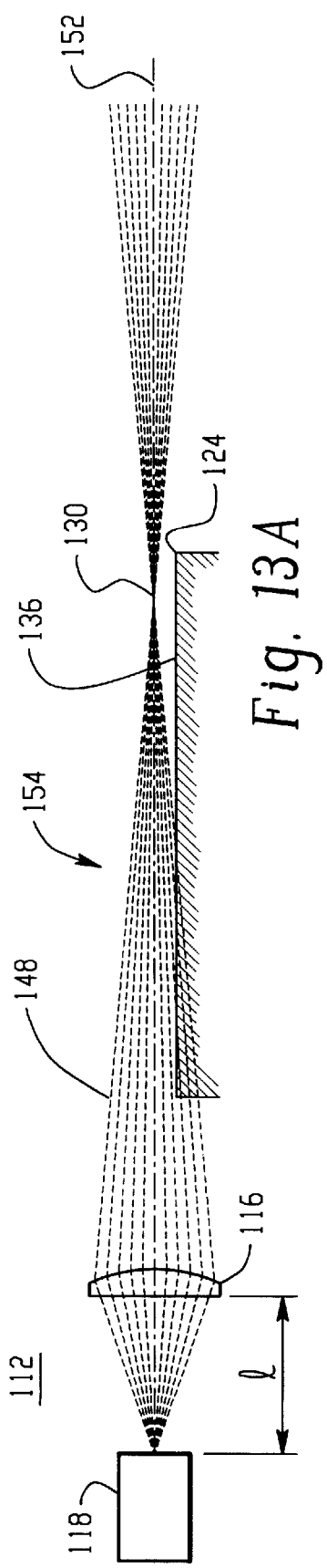
FIG. 13A is a schematic of optics focused above the surface of a wafer.
Figure 13B:
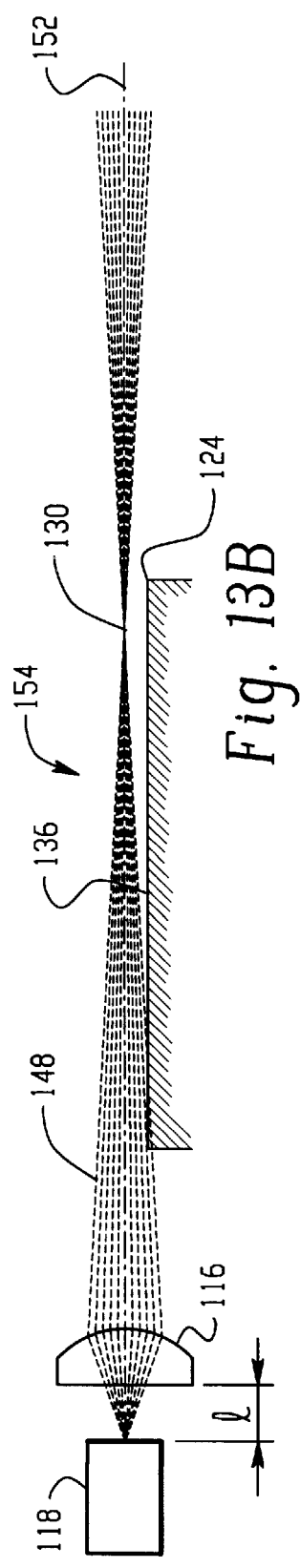
FIGS. 13B and 13C are schematics of optics focussed above the surface of the wafer with shorter focal lengths than those of FIGS. 12C and 12D.
Figure 13C:
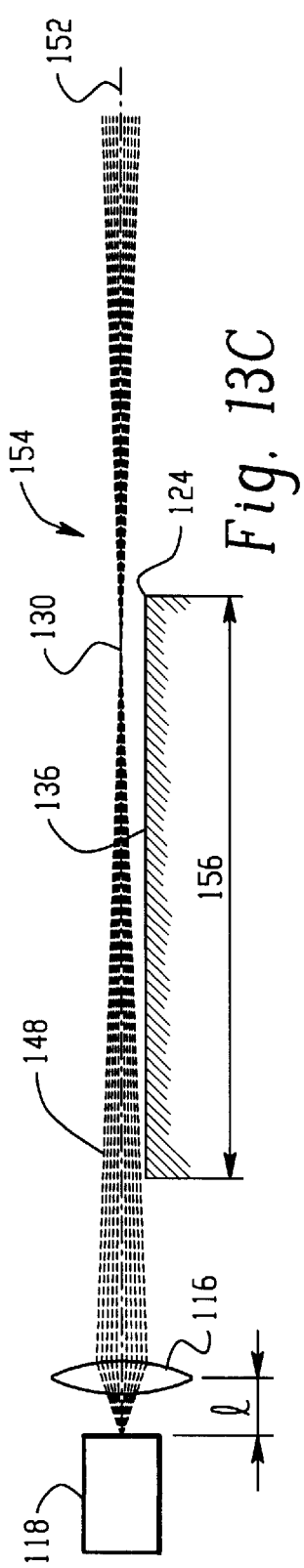

FIGS. 13A–13C show how the focal length L of the selected lens affects the viewing beam 148 of the optics monitoring system 112. By selecting a lens with a short focal length, the viewing beam is narrowed allowing light only along the path where the emission signal is the strongest. Using a lens having a short focal length reduces the signal strength, because the viewing beam 148 is narrower. However, signal-to-background is increased because the amount of background monitored by narrower beam is also reduced. FIG. 13C demonstrates the results of implementation of short focal-length.

FIG. 13A shows the original configuration, with the lens 116 and fiber optic fibers 118 on the left and the wafer located at the bottom of the figure. The wafer is shown slightly below the rays depicting the viewing beam 148. In FIG. 13A one can see that the viewing beam axis must be located well above the wafer in order to not cut off rays near the edges 124 of the wafer. Shorter focal-lengths are presented in FIGS. 13B And 113C. A lens with a shorter focal length allows redirection of the rays before they spread much, which maintains a beam-like quality of the viewing beam 148. A narrower viewing beam can be lowered closer to the wafer surface 136 and thereby receive light from the regions just above the wafer surface 136 where the by-product signal is the strongest.

It is appreciated that while the invention has been described with a degree of particularity it is the intent that the invention include all modifications from the disclosed design falling within the spirit or scope of the appended claims.

What is claimed is:

1. A wafer processing system comprising:
   a) a wafer processing chamber including a support for positioning at least one wafer within an interior region of said chamber;
   b) a source that routes a wafer treatment material into the processing chamber for removing a coating from an exposed surface of the at least one wafer, said wafer treatment material reacting with said coating to form a light emitting reactant product; and
   c) receiving optics mounted to the chamber adapted to monitor concentrations of said reactant product of said coating and said wafer treatment material by focusing on the light emitted by said reactant product within 0.6 inches of a surface of said at least one wafer.

2. The optical system of claim 1 further comprising a filter mounted to the chamber for filtering signals emitted from said interior region of the wafer processing chamber.

3. A wafer processing system comprising:
   a) a wafer processing chamber including a support for positioning at least one wafer within an interior region of the wafer processing chamber;
   b) a source that routes a wafer treatment material into the wafer processing chamber for removing a coating from an exposed surface of the at least one wafer; and
   c) receiving optics mounted to the chamber near a first edge of said wafer adapted to monitor concentrations of a reactant product of said coating and said wafer treatment material by monitoring optical emission spectra originating from above said at least one wafer, said receiving optics focused within 0.6 inches of a surface of said wafer.

4. The optical system of claim 3 further comprising a filter mounted to the chamber for filtering signals emitted from said interior region of the wafer processing chamber.

5. A wafer processing system comprising:
   a) a wafer processing chamber including a support for positioning at least one wafer within an interior region of the wafer processing chamber;
   b) a source that routes a wafer treatment material into the wafer processing chamber for removing a coating from an exposed surface of the at least one wafer; and
   c) receiving optics mounted to the chamber near a first edge of said wafer for monitoring concentrations of a reactant product of said coating and said wafer treatment material by monitoring optical emission spectra originating from above said at least one wafer, said receiving optics comprise fiber optic fibers that are configured in a linear array, said receiving optics focused within 0.6 inches of a surface of said wafer.

6. A wafer processing system comprising:
   a) a wafer processing chamber including a support for positioning at least one wafer within an interior region of the wafer processing chamber;
   b) a source that routes a wafer treatment material into the wafer processing chamber for removing a coating from an exposed surface of the at least one wafer; and
   c) receiving optics mounted to the chamber near a first edge of said wafer for monitoring concentrations of a reactant product of said coating and said wafer treatment material by monitoring optical emission spectra originating from above said at least one wafer, said receiving optics are recessed from said interior region of the wafer processing chamber.

7. A wafer processing system comprising:
   a) a wafer processing chamber including a support for positioning at least one wafer within an interior region of the wafer processing chamber, said wafer processing chamber has a slot extending into a sidewall of the wafer processing chamber;
   b) a source that routes a wafer treatment material into the wafer processing chamber for removing a coating from an exposed surface of the at least one wafer;
   c) receiving optics mounted to the chamber near a first edge of said wafer for monitoring concentrations of a reactant product of said coating and said wafer treatment material by monitoring optical emission spectra originating from above said at least one wafer; and
   d) a viewing dump mounted to said wafer processing chamber, said viewing dump is mounted to said wafer processing chamber near the slot to absorb light entering said slot.

8. A wafer processing system comprising:
   a) a wafer processing chamber including a support for positioning at least one wafer within an interior region of the wafer processing chamber;
   b) a source that routes a wafer treatment material into the wafer processing chamber for removing a coating from an exposed surface of the at least one wafer;
   c) receiving optics mounted to the chamber near a first edge of said wafer for monitoring concentrations of a reactant product of said coating and said wafer treatment material by monitoring optical emission spectra originating from above said at least one wafer; and d) a viewing dump mounted to said wafer processing chamber, the viewing dump comprises a box and a light capturing device.

9. A wafer processing system comprising:
a) a wafer processing chamber including a support for positioning at least one wafer within an interior region of the wafer processing chamber;
b) a source that routes a wafer treatment material into the wafer processing chamber for removing a coating from an exposed surface of the at least one wafer; and
c) receiving optics mounted to the chamber near a first edge of said wafer for monitoring concentrations of a reactant product of said coating and said wafer treatment material by monitoring optical emission spectra originating from above said at least one wafer, said receiving optics comprise multiple fiber optic fibers having a input ends that are configured in a fan shaped array, said receiving optics focused within 0.6 inches of a surface of said wafer.

10. A wafer processing system comprising:
a) a wafer processing chamber including a support for positioning at least one wafer;
b) a source that routes a wafer treatment material into the processing chamber for removing a coating from said at least one wafer; and
c) receiving optics mounted to the chamber, said receiving optics including a lens and a plurality of fiber optic fibers each of said fiber optic fibers positioned with respect to said lens to monitor light emitted by a local concentration of a reactant product of said coating and said wafer treatment material on a surface of said at least one wafer, such that said optics monitor a representative distribution of points on said surface.

11. The optical system of claim 10 further comprising a viewing dump mounted to said wafer processing chamber.

12. A wafer processing system comprising:
a) a wafer processing chamber including a support for positioning at least one wafer within an interior region of the wafer processing chamber;
b) a source that routes a wafer treatment material into the wafer processing chamber for removing a coating from an exposed surface of the at least one wafer;
c) receiving optics configured in a planar array mounted to the chamber near a first edge of said wafer adapted to monitor concentrations of a reactant product of said coating and said wafer treatment material by monitoring optical emission spectra originating from a surface of said at least one or more wafer, said receiving,optics including a bi-convex lens;
d) a viewing dump comprising a box and a diamond shaped reflective member mounted to said wafer processing chamber to prevent unwanted signals from entering said receiving optics; and
e) a low pass filter mounted to the chamber for filtering signals emitted by said concentrations of a reactant product of said coating and said wafer treatment material.

13. A method of monitoring a wafer treatment process comprising:
a) providing a wafer having a coating on an exposed surface;
b) supplying wafer treatment material to said surface to remove said coating; and
c) monitoring concentrations of a reactant product of said coating and said wafer treatment material in a focused area extending from said surface with optics that determines said concentrations using optical emission spectroscopy signals originating from said reactant product in said focused area.

14. The method of claim 13 further comprising the step of absorbing unwanted signals with a viewing dump to prevent the unwanted signals from being monitored by said optics.

15. The method of claim 13 further comprising the step of polarizing signals that are reflected off of said surface.

16. The method of claim 13 further comprising the step of filtering signals emitted by said concentrations of the reactant product of said coating and said wafer treatment material.

17. A method of monitoring a wafer treatment process comprising:
a) providing a wafer having a coating on an exposed surface;
b) supplying wafer treatment material to said surface to remove said coating; and
c) focusing optics within 0.6 inches of a surface of said wafer to monitor concentrations of a reactant product of said coating and said wafer treatment material by monitoring optical emission spectra originating from the reactant product.

18. The method of claim 17 further comprising the step of absorbing unwanted signal with a viewing dump to prevent the unwanted signal from being monitored by said optics.

19. The method of claim 17 further comprising the step of filtering signals emitted by said concentrations of the reactant product of said coating and said wafer treatment material.

20. The method of claim 19 further comprising the step of absorbing unwanted signals with a viewing dump to prevent the unwanted signals from being monitored by said optics.

21. A method of monitoring a wafer treatment process comprising:
a) providing a wafer having a coating on an exposed surface;
b) supplying wafer treatment material to said surface to remove said coating; and
c) monitoring concentrations of a reactant product of said coating and said wafer treatment material by monitoring optical emission spectra originating from the reactant product in a region above said wafer with optics, said optics comprise fiber optic fibers that are configured in a generally flat array, said receiving optics focused within 0.6 inches of a surface of said wafer.

22. A method of monitoring a wafer treatment process comprising:
a) providing a wafer having a coating on an exposed surface;
b) supplying wafer treatment material to said surface to remove said coating; and
c) monitoring concentrations of a reactant product of said coating and said wafer treatment material by monitoring optical emission spectra originating from the reactant product in a region above said wafer with optics, said optics comprise fiber optic fibers that are configured in a linear array, said receiving optics focused within 0.6 inches of a surface of said wafer.

23. A method of monitoring a wafer treatment process comprising:
a) providing a wafer having a coating on an exposed surface;

b) supplying wafer treatment material to said surface to remove said coating; and c) monitoring concentrations of a reactant product of said coating and said wafer treatment material by monitoring optical emission spectra originating from the reactant product in a region above said wafer with optics, said optics comprise fiber optic fibers that are configured in a fan shaped array, said receiving optics focused within 0.6 inches of a surface of said wafer.

24. A method of monitoring a wafer treatment process comprising:

a) providing a wafer having a coating on an exposed surface;

b) supplying wafer treatment material in the form of a plasma to said surface to remove said coating; and c) monitoring concentrations of a reactant product of said coating and said wafer treatment material by focusing optics on a representative distribution of points on said surface to view optical emissions from reactant products at the distribution of points.

25. A method of monitoring a wafer treatment process comprising:

a) providing a wafer having a coating on an exposed surface;

b) supplying wafer treatment material to said surface to remove said coating;

c) filtering signals emitted by said concentrations of the reactant product of said coating and said wafer treatment material; and d) monitoring concentrations of a reactant product of said coating and said wafer treatment material by monitoring optical emission spectra originating from the reactant product in a region above said wafer with optics, said optics are recessed.

26. A wafer processing system comprising:

a) a wafer processing chamber including a support for positioning at least one wafer within an interior region of said chamber;

b) a source that routes a wafer treatment material into the processing chamber for removing a coating from an exposed surface of the at least one wafer, said wafer treatment material reacting with said coating to form a light emitting reactant product;

c) receiving optics mounted to the chamber adapted to monitor concentrations of said reactant product of said coating and said wafer treatment material by focusing on the light emitted by said reactant product near a surface of said at least one wafer; and d) a viewing dump mounted to said wafer processing chamber to absorb light within the chamber.

27. The optical system of claim 26 wherein the viewing dump is mounted in an interior of said wafer processing chamber within a field of view of the receiving optics.

28. The optical system of claim 26 further wherein said wafer processing chamber has a slot extending into a sidewall of the wafer processing chamber and wherein said viewing dump is mounted to said wafer processing chamber within the slot.

29. The optical system of claim 26 wherein the viewing dump comprises a plurality of razor blades connected together.

30. A wafer processing system comprising:

a) a wafer processing chamber including a support for positioning at least one wafer within an interior region of the wafer processing chamber;

b) a source that routes a wafer treatment material into the wafer processing chamber for removing a coating from an exposed surface of the at least one wafer;

c) receiving optics mounted to the chamber near a first edge of said wafer adapted to monitor concentrations of a reactant product of said coating and said wafer treatment material by monitoring optical emission spectra originating from above said at least one wafer; and, d) a viewing dump mounted to said wafer processing chamber.

31. A method of monitoring a wafer treatment process comprising:

a) providing a wafer having a coating on an exposed surface;

b) supplying wafer treatment material to said surface to remove said coating;

c) monitoring concentrations of a reactant product of said coating and said wafer treatment material by monitoring optical emission spectra originating from the reactant product; and, d) polarizing signals emitted by said concentrations of the reactant product of said coating and said wafer treatment material.

* * * * *